United States Patent
Man et al.

(10) Patent No.: US 11,600,463 B2
(45) Date of Patent: Mar. 7, 2023

(54) CROSS-SECTION OBSERVATION DEVICE, AND CONTROL METHOD

(71) Applicant: HITACHI HIGH-TECH SCIENCE CORPORATION, Tokyo (JP)

(72) Inventors: Xin Man, Tokyo (JP); Junzo Azuma, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 666 days.

(21) Appl. No.: 16/495,763

(22) PCT Filed: Mar. 27, 2018

(86) PCT No.: PCT/JP2018/012607
§ 371 (c)(1),
(2) Date: Sep. 19, 2019

(87) PCT Pub. No.: WO2018/181407
PCT Pub. Date: Oct. 4, 2018

(65) Prior Publication Data
US 2020/0111639 A1    Apr. 9, 2020

(30) Foreign Application Priority Data

Mar. 27, 2017 (JP) .............................. JP2017-060901

(51) Int. Cl.
*H01J 37/28* (2006.01)
*G06T 5/50* (2006.01)
*H01J 37/26* (2006.01)

(52) U.S. Cl.
CPC ................ *H01J 37/28* (2013.01); *G06T 5/50* (2013.01); *H01J 37/265* (2013.01);
(Continued)

(58) Field of Classification Search
CPC .. H01J 37/00; H01J 37/02; H01J 37/26; H01J 37/28; H01J 37/265; H01J 37/3056;
(Continued)

(56) References Cited

U.S. PATENT DOCUMENTS

| 5,645,066 A | 7/1997 | Gandini et al. |
| 2006/0119622 A1 | 6/2006 | Kariathungal et al. |

(Continued)

FOREIGN PATENT DOCUMENTS

| JP | S64-065760 A | 3/1989 |
| JP | H10-043182 A | 2/1998 |

(Continued)

OTHER PUBLICATIONS

International Search Report and Written Opinion, and English translation, from International Application No. PCT/JP2018/012607, dated May 15, 2018, 16 pages.

*Primary Examiner* — Jason L McCormack
(74) *Attorney, Agent, or Firm* — Crowell & Moring LLP

(57) ABSTRACT

This cross-section observation device bombards an object with a charged particle beam to repeatedly expose cross-sections of the object, bombards at least some of the cross-sections from among the plurality of the exposed cross-sections with a charged particle beam to acquire cross-sectional image information describing each of the at least some of the cross-sections, generates for each of these cross-sections a cross-sectional image described by the cross-sectional image information acquired, and generates a three-dimensional image in which the generated cross-sectional images are stacked together. This cross-section observation device displays a first three-dimensional image along with a second three-dimensional image, the first three-dimensional image being a three-dimensional image from the stacking of first cross-sectional images, which are cross-sectional images of the cross-sections described by the (Continued)

corresponding cross-sectional image information acquired on the basis of a first condition, and the second three-dimensional image being a three-dimensional image from the stacking of second cross-sectional images, which are cross-sectional images of the cross-sections described by the corresponding cross-sectional image information acquired on the basis of a second condition.

10 Claims, 10 Drawing Sheets

(52) U.S. Cl.
CPC ............... *G06T 2207/10061* (2013.01); *G06T 2207/10072* (2013.01); *G06T 2207/20212* (2013.01); *H01J 2237/2801* (2013.01); *H01J 2237/2803* (2013.01)

(58) Field of Classification Search
CPC .. H01J 37/22; H01J 37/317; H01J 2237/2801; H01J 2237/2803; H01J 2237/226; H01J 2237/2815; H01J 2237/31745; G06T 5/50; G06T 2207/10061; G06T 2207/10072; G06T 2207/20212

USPC .............................. 250/306, 307, 311, 336.1
See application file for complete search history.

(56) References Cited

U.S. PATENT DOCUMENTS

| | | | |
|---|---|---|---|
| 2006/0135865 | A1 | 6/2006 | Bharara et al. |
| 2009/0232378 | A1* | 9/2009 | Nakamura ............... G06T 7/337 |
| | | | 382/131 |
| 2013/0082176 | A1 | 4/2013 | Yamamoto et al. |
| 2014/0291508 | A1* | 10/2014 | Uemoto ............. G01N 23/2255 |
| | | | 250/306 |
| 2015/0060664 | A1 | 3/2015 | Man et al. |
| 2016/0343541 | A1 | 11/2016 | Man et al. |
| 2017/0278668 | A1* | 9/2017 | Man .................... H01J 37/3056 |

FOREIGN PATENT DOCUMENTS

| | | | |
|---|---|---|---|
| JP | 2006-142021 A | | 6/2006 |
| JP | 2013-065512 A | | 4/2013 |
| JP | 2014-192090 A | | 10/2014 |
| JP | 2015-050126 A | | 3/2015 |

\* cited by examiner

CROSS-SECTION OBSERVATION DEVICE, AND CONTROL METHOD

RELATED APPLICATION

This application is a 371 application of PCT/JP2018/012607 having an international filing date of Mar. 27, 2018, which claims priority to JP2017-060901 filed Mar. 27, 2017, the entire content of each of which is incorporated herein by reference.

TECHNICAL FIELD

The present invention relates to a cross section observing apparatus and a control method.

BACKGROUND ART

Techniques for obtaining a sectional image of a cross section of an object by irradiating it with a beam of charged particles are being studied and developed.

As for these techniques, known are cross section working observation conditions for obtaining plural sectional images of a sample by repeatedly executing, at every set interval along a prescribed direction of the sample, a cross section exposing step of exposing a cross section of the sample by applying a focused ion beam to the sample and a sectional image obtaining step of obtaining a sectional image of the cross section by irradiating the cross section with an electron beam. In the sectional image obtaining step, sectional images are obtained under different conditions that are set for plural respective regions of the cross section (refer to PTL 1).

CITATION LIST

Patent Literature

PTL 1: JP-A-2015-50126

SUMMARY OF INVENTION

Technical Problem

However, in the related-art cross section working observation conditions, no consideration is given to comparing plural sectional images obtained under different conditions for a certain cross section of the sample. As a result, with these cross section working observation conditions, work of comparing these sectional images takes time and labor.

The present invention has been made in view of the problems in the art, and an object of the present invention is therefore to provide a cross section observing apparatus and a control method that make it possible to compare plural sectional images easily that are obtained for a cross section of an object under different observation conditions.

Solution to Problem

According to one aspect of the present invention, there may be provided A cross section observing apparatus configured to: irradiate an object with a charged particle beam to expose cross sections of the object repeatedly; from among a plurality of the exposed cross sections, irradiate at least a part of the exposed cross sections with a charged particle beam to obtain pieces of sectional image information representing the at least the part of the exposed cross sections; generate sectional images of the cross sections represented by the respective obtained pieces of sectional image information; and generate a three-dimensional image by superimposing each of the generated sectional images, wherein the cross section observing apparatus is configured to display a first three-dimensional image and a second three-dimensional image together on a display unit, wherein the first three-dimensional image is a three-dimensional image obtained by superimposing first sectional images that are sectional images of the cross sections represented by respective pieces of the sectional image information obtained under a first condition from among a plurality of observation conditions that are different from one another, and wherein the second three-dimensional image is a three-dimensional image obtained by superimposing second sectional images that are sectional images of the cross sections represented by respective pieces of the sectional image information obtained under a second condition from among the plurality of observation conditions, the second condition being different from the first condition.

According to another aspect of the present invention, the cross section observing apparatus may be configured to: display the first three-dimensional image and the second three-dimensional image together on the display unit in such a manner as to coincide with each other in posture.

According to still another aspect of the present invention, the cross section observing apparatus may be configured to: according to an operation received from a user, display the first three-dimensional image and the second three-dimensional image together on the display unit in such a manner as not to be superimposed on each other on the display unit.

According to still another aspect of the present invention, the cross section observing apparatus may be configured to: according to an operation received from a user, display the first three-dimensional image and the second three-dimensional image together on the display unit in such a manner as to be superimposed on each other in position and posture on the display unit.

According to still another aspect of the present invention, the cross section observing apparatus may be configured to: in a case information indicating the cross section represented by one of the first sectional images that are superimposed on each other to form the first three-dimensional image is received from a user, display the first sectional image representing the cross section indicated by the received information and the second sectional image representing the cross section among the second sectional images that are superimposed on each other to form the second three-dimensional image together on the display unit.

According to still another aspect of the present invention, the cross section observing apparatus may be configured to: in a case an operation for changing the postures of the three-dimensional images displayed on the display unit is received, change both of the posture of the first three-dimensional image and the posture of the second three-dimensional image to postures corresponding to the operation.

According to still another aspect of the present invention, the cross section observing apparatus may be configured to perform first processing and second processing in parallel, the first processing may comprise generating the first three-dimensional image by superimposing, on each other, the first sectional images of the cross sections represented by the respective pieces of sectional image information obtained under the first condition, and the second processing may comprise generating the second three-dimensional image by superimposing, on each other, the second sectional images of the cross sections represented by the respective pieces of sectional image information obtained under the second condition.

According to still another aspect of the present invention, the cross section observing apparatus may be configured to: store information that correlates the pieces of sectional image information obtained under the first condition with the pieces of sectional image information obtained under the second condition in a storage unit; obtain the information from the storage unit; and perform the first processing and the second processing on the basis of the obtained information.

According to still another aspect of the present invention, individual points of the first three-dimensional image and individual points of the second three-dimensional image represent may position in the same three-dimensional coordinate system.

According to still another aspect of the present invention, there may be provided a control method of a cross section observing apparatus comprising: irradiating an object with a charged particle beam to expose cross sections of the object repeatedly; from among a plurality of the exposed cross sections, irradiating at least a part of the exposed cross sections with a charged particle beam to obtain pieces of sectional image information representing the at least the part of the exposed cross sections; generating sectional images of the cross sections represented by the respective obtained pieces of sectional image information; generating a three-dimensional image by superimposing each of the generated sectional images; and displaying a first three-dimensional image and a second three-dimensional image together on a display unit, wherein the first three-dimensional image is a three-dimensional image obtained by superimposing first sectional images that are sectional images of the cross sections represented by respective pieces of the sectional image information obtained under a first condition from among a plurality of observation conditions that are different from one another, and wherein the second three-dimensional image is a three-dimensional image obtained by superimposing second sectional images that are sectional images of the cross sections represented by respective pieces of the sectional image information obtained under a second condition from among the plurality of observation conditions, the second condition being different from the first condition.

Advantageous Effects of Invention

The invention can provide a cross section observing apparatus and a control method that make it possible to compare plural sectional images easily that are obtained for a cross sections of an object under different observation conditions.

DESCRIPTION OF EMBODIMENTS

Embodiment

Figure 1:
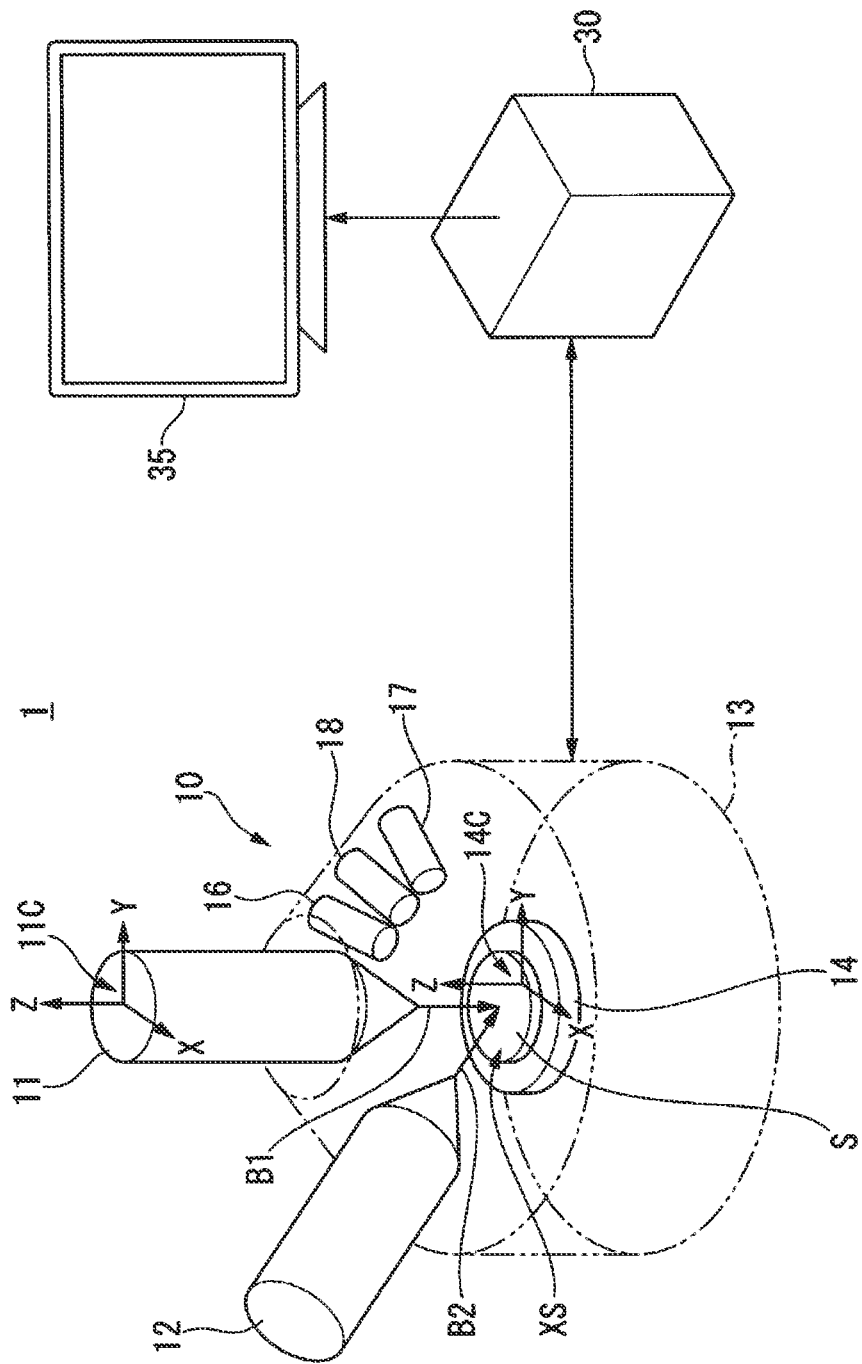
FIG. 1 shows an example of a configuration of a cross section observing apparatus 1 according to an illustrative embodiment.

An illustrative embodiment of the present invention will be hereinafter described with reference to the drawings.

<Outline of Process Executed by Cross Section Observing Apparatus>

First, a process that is executed by a cross section observing apparatus 1 according to the illustrative embodiment will be outlined.

The cross section observing apparatus 1 is an apparatus for generating sectional images of plural respective cross sections of an object and displaying a three-dimensional image for observation by a user on the basis of the generated plural sectional images. In this example, the sectional images are two-dimensional images representing the respective cross sections. The three-dimensional image is a three-dimensional image generated by superimposing, on each other, the plural sectional images which are two-dimensional images.

The cross section observing apparatus 1 exposes cross sections of an object repeatedly by irradiating the object with a charged particle beam. The charged particle beam is a beam of focused charged particles. The cross section observing apparatus 1 obtains sectional image information representing each of at least part of the cross sections by irradiating the at least part of the exposed plural cross sections with a charged particle beam and detecting secondary particles generated from the cross sections. The cross section observing apparatus 1 generates, on the basis of each obtained piece of sectional image information, a sectional image of the cross section represented by the obtained piece of sectional image information. The cross section observing apparatus 1 displays the generated sectional image. The sectional image generated by the cross section observing apparatus 1 represents an observable internal structure in the cross section (cut surface) of the object. That is, the cross section observing apparatus 1 allows a user to observe the observable internal structure in the cut surface. For example, the internal structure is a chemical structure in the cut surface or a crystal structure in the cut surface.

The cross section observing apparatus 1 generates a three-dimensional image as a superimposition of generated plural sectional images. And the cross section observing apparatus 1 displays the generated three-dimensional image. In this manner, the cross section observing apparatus 1 allows the user to observe a stereoscopic (three-dimensional) internal structure of an object.

Furthermore, the cross section observing apparatus 1 can obtain sectional image information representing a cross section of an object on the basis of each of a plurality of observation conditions that are different from each other. That is, the cross section observing apparatus 1 can generate a sectional image representing an internal structure corresponding to a new observation condition every time the observation conditions is changed. In this example, a plurality of observation conditions is discriminated from each other by a combination of a kind of a charged particle beam applied to the surface of the object and a kind of detected secondary particle etc.

Incidentally, in a cross section observing apparatus X (e.g., conventional cross section observing apparatus) that is different from the cross section observing apparatus 1, even if sectional images corresponding to plural respective observation conditions can be generated, no consideration is given to comparing those sectional images. As a result, in the cross section observing apparatus X, it takes time and labor for a user to do work of comparing those sectional images.

In view of the above, the cross section observing apparatus 1 of this example displays, together, on a display unit, a first three-dimensional image that is a three-dimensional image as a superimposition of first sectional images that are sectional images of a cross section (a cross section of a sample S) represented by pieces of sectional image information obtained under a first condition among a plurality of observation conditions that are different from each other and a second three-dimensional image that is a three-dimensional image as a superimposition of second sectional images that are sectional images of the cross section represented by pieces of sectional image information obtained under a second condition that is different from the first condition among the plurality of observation conditions. As a result, the cross section observing apparatus 1 can easily compare plural sectional images obtained for a cross section of the object under different observation conditions.

In the following, a detailed description will be made of sectional image information obtaining processing that the cross section observing apparatus 1 obtains sectional image information and three-dimensional image display processing that the cross section observing apparatus 1 displays a first three-dimensional image and a second three-dimensional image together. In the following, a case that the object is a sample S will be described as an example. For example, the sample S is a conductive sample. Alternatively, the sample S may be either an insulative sample or a semiconductive sample (semiconductor sample). Instead of the sample S, the object may be another type of object, for example, a portion of a life form (living body) such as cells or a bone.

<A Plurality of Observation Conditions in Cross Section Observing Apparatus>

A plurality of observation conditions of the cross section observing apparatus 1 will be described below. For example, the plurality of observation conditions is five observation conditions, that is, SIM (scanning ion microscope) image observation conditions, SEM (scanning electron microscope) image observation conditions, BSE (back scattering electron) image observation conditions, EDS (energy dispersive X-ray spectrometer) map observation conditions, and EBSD (electron backscatter diffraction) map observation conditions. That is, the cross section observing apparatus 1 can obtain sectional image information representing a cross section of a sample S under each of these five observation conditions. The plurality of observation conditions may include another or other observation conditions in place of all or part of the five observation conditions. The number of observation conditions may be any number that is larger than or equal to 2.

The STM image observation condition is a condition for detection of secondary electrons as detection of secondary particles using a focused ion beam as a charged particle beam. The term "secondary electrons" means scattered electrons etc. scattered by the focused ion beam among the electrons included in the sample S. The cross section observing apparatus 1 generates a SIM image as the sectional image in generating a sectional image of a cross section of an object under the SIM image observation condition.

The SEM image observation condition is a condition for detection of secondary electrons as detection of secondary particles using an electron beam as a charged particle beam. The term "secondary electrons" means scattered electrons etc. scattered by the electron beam among the electrons included in the sample S. The cross section observing apparatus 1 generates a SEM image as the sectional image in generating a sectional image of a cross section of an object under the SEM image observation condition.

The BSE image observation condition is a condition for detection of secondary electrons as detection of secondary particles using an electron beam as a charged particle beam. The term "secondary electrons" means reflection electrons etc. reflected by the sample S among the electrons included in the electron beam. The cross section observing apparatus 1 generates a BSE image as the sectional image in generating a sectional image of a cross section of an object under the BSE image observation condition.

The EDS map observation condition is a condition for detection of X-rays as detection of secondary particles using an electron beam as a charged particle beam. The cross section observing apparatus 1 generates an EDS map as the sectional image in generating a sectional image of a cross section of an object under the EDS map observation condition.

The EBSD map observation condition is a condition for detection of an intensity distribution (diffraction figure) of secondary electrons, that is, an EBSD pattern, as detection of secondary particles using an electron beam as a charged particle beam. The term "secondary electrons" means scattered electrons etc. scattered by the electron beam among the electrons included in the sample S. The cross section observing apparatus 1 generates an EBSD map as the sectional image in generating a sectional image of a cross section of an object under the EBSD map observation condition.

<Configuration of Cross Section Observing Apparatus>

The configuration of the cross section observing apparatus 1 will be described below. FIG. 1 shows an example of a configuration of the cross section observing apparatus 1 according to the illustrative embodiment.

The cross section observing apparatus 1 is equipped with a charged particle microscope 10, a control device 30, and a display device 35. Although in the cross section observing apparatus 1 of this example, the charged particle microscope 10, the control device 30, and the display device 35 are provided separately, all or part of the charged particle microscope 10, the control device 30, and the display device 35 may be integrated together.

For example, the charged particle microscope 10 is equipped with a focused ion beam (FIB) column 11, an electron beam (EB) column 12, and a sample chamber 13.

The focused ion beam column 11 emits a focused ion beam B1 in which ions of a predetermined kind are focused. For example, the focused ion beam column 11 is equipped with an ion source (e.g., ion gun), an ion acceleration unit, and an ion irradiation unit. The ion source generates ions. The ion acceleration unit applies an electric field to the ions generated by the ion source in an ion acceleration direction and thereby accelerates the ions. The ion acceleration direction is a direction that goes along the center axis of the focused ion beam column 11 and is directed from the ion source of the focused ion beam column 11 to an exit through which the focused ion beam B1 of the focused ion beam column 11 is to be output.

The ion irradiation unit has an electrostatic lens and focuses the ions accelerated by the ion acceleration unit by applying an electric field to the ions by the electrostatic lens. The ion irradiation unit irradiates a prescribed irradiation region with the focused ions as a focused ion beam B1. The irradiation region will be described later. The electrostatic lens may be either of an acceleration type or of a deceleration type. Alternatively, the ion irradiation unit may have a configuration that it is equipped with a magnetic lens and a magnetic field is applied to ions accelerated by the ion acceleration unit by the magnetic lens to focus the ions.

The focused ion beam column 11 is housed in the sample chamber 13. The sample chamber 13 is equipped with a stage 14 which is a sample stage on which a sample S is placed and a stage drive unit for varying the position and posture of the stage 14 according to a request from the control device 30. In this example, the position of the stage 14 is a position in a three-dimensional coordinate system 11C and is represented by a position of the origin of a three-dimensional coordinate system 14C. The posture of the stage 14 is represented by directions of each of the coordinate axes of the three-dimensional coordinate system 14C with respect to each of the coordinate axes of the three-dimensional coordinate system 11C. The three-dimensional coordinate system 11C is a three-dimensional coordinate system that is correlated with a predetermined position in the focused ion beam column 11. For example, the predetermined position is the position of the center of gravity of the focused ion beam column 11. In FIG. 1, to prevent the figure to become unduly complex, the position of the origin of the three-dimensional coordinate system 11C is deviated from the position of its center of gravity. Instead, the predetermined position may be another position that is correlated with the focused ion beam column 11. Since the focused ion beam column 11 is fixed and does not move, in the sample chamber 13, the position of the origin of the three-dimensional coordinate system 11C and the directions of the respective coordinate axes of the three-dimensional coordinate system 11C are fixed and do not move. The three-dimensional coordinate system 14C is a three-dimensional coordinate system that is correlated with the center of the top surface of the stage 14. Thus, when the stage 14 is moved, the three-dimensional coordinate system 14C is moved together with the stage 14. In FIG. 1, to prevent the figure to become unduly complex, the position of the origin of the three-dimensional coordinate system 14C is deviated from the position of the above-mentioned center.

In this example, the Z-axis direction of the three-dimensional coordinate system 11C coincides with the center axis direction of the focused ion beam column 11. The X-axis direction of the three-dimensional coordinate system 11C is the direction that is perpendicular to the Z-axis direction and coincides with the direction that goes from the focused ion beam column 11 toward the electron beam column 12. The Y-axis direction of the three-dimensional coordinate system 11C is perpendicular to the X-axis direction and the Z-axis direction. Instead, the X-axis direction, the Y-axis direction, and the Z-axis direction of the three-dimensional coordinate system II C may coincide with other directions.

The focused ion beam column 11 is installed at such a position that the center axis of the focused ion beam column 11 is perpendicular to the top surface of the stage 14 in the case where the position and posture of the stage 14 coincide with a reference position and a reference posture that are a predetermined reference position and posture. To simplify the description, the following description will be made of a case that the user does not change the position and posture of the stage 14 from the reference position and the reference posture.

In this example, the X-axis direction, the Y-axis direction, and the Z-axis direction of the three-dimensional coordinate system 14C coincide with the X-axis direction, the Y-axis direction, and the Z-axis direction of the three-dimensional coordinate system 11C, respectively, in the case where the position and posture of the stage 14 coincide with the reference position and the reference posture. Instead, in this case, the X-axis direction, the Y-axis direction, and the Z-axis direction of the three-dimensional coordinate system 14C may coincide with other directions.

The focused ion beam column 11 is installed at such a position as to be able to irradiate the above-mentioned irradiation region with a focused ion beam B1. This irradiation region is a planar region that is set in a plane that is parallel with the top surface of the stage 14 in the case where the position and posture of the stage 14 coincide with the reference position and the reference posture. The following description will be made for an example case that in the above-mentioned case the irradiation region is a region that is set inside of the top surface of the stage 14. Instead, the irradiation region may be a region that is set in a range including all or part of the top surface of the stage 14 in the above-mentioned case. The irradiation region is always fixed and does not move together with the top surface of the stage 14 even in a case that the stage drive unit has changed the position and posture of the stage 14. That is, the stage drive unit can translate or incline a sample S mounted on the top surface of the stage 14 relative to the irradiation region by varying the position and posture of the stage 14.

The electron beam column 12 emits an electron beam B2 that is a focused electron beam. For example, the electron beam column 12 is equipped with an electron source (e.g., electron gun), an electron acceleration unit, and an electron irradiation unit. The electron source generates electrons. The electron acceleration unit applies an electric field to the electrons generated by the electron source in an electron acceleration direction and thereby accelerates the electrons. The electron acceleration direction is a direction that goes along the center axis of the focused electron beam column 12 and is directed from the electron source of the electron beam column 12 to an exit through which its electron beam B2 is to be output. The electron irradiation unit has an electrostatic lens and focuses the electrons accelerated by the electron acceleration unit by applying an electric field to the electrons by the electrostatic lens. The electron irradiation unit emits the focused electrons from the exit as an electron beam B2. The electrostatic lens may be either of an acceleration type or of a deceleration type. Alternatively, the electron irradiation unit may have a configuration that it is equipped with a magnetic lens and a magnetic field is applied to electrons accelerated by the electron acceleration unit by the magnetic lens to focus the electrons.

The electron beam column 12 is also equipped with an intracolumn reflection electron detector (not shown), which detects reflection electrons (mentioned above) as secondary electrons. The intracolumn reflection electron detector outputs a signal containing information indicating the detected secondary electrons to the control device 30. The information indicating the secondary electrons is information indicating the number of the reflection electrons.

The electron beam column 12 is housed in the sample chamber 13 together with the focused ion beam column 11. The electron beam column 12 is installed at such a position that the center axis of the electron beam column 12 is inclined with respect to the top surface of the stage 14 by a prescribed angle in the case where the position and posture of the stage 14 coincide with the reference position and the reference posture. Furthermore, the electron beam column 12 is installed at such a position as to be able to irradiate the above-mentioned irradiation region with an electron beam B2. It is preferable that the electron beam column 12 is disposed so that the direction that goes along the center axis of the electron beam column 12 and is directed from the electron source of the electron beam column 12 to its exit through which an electron beam B2 is to be output is perpendicular to the direction that goes along the center axis of the focused ion beam column 11 and is directed from the ion source of the focused ion beam column 11 to its exit through which a focused ion beam B1 is to be output.

The charged particle microscope 10 is further equipped with a secondary electron detector 16, an EDS detector 17, and an EBSD detector 18.

The secondary electron detector 16 detects secondary electrons that are generated from the sample S when the sample S is irradiated with a focused ion beam B1. These secondary electrons are scattered electrons etc. that are scattered by the focused ion beam B1 among the electrons included in the sample S. The secondary electron detector 16 detects secondary electrons that are generated from the sample S when the sample S is irradiated with an electron beam B2. These secondary electrons are scattered electrons etc. that are scattered by the electron beam B2 among the electrons included in the sample S. The secondary electron detector 16 outputs a signal containing information indicating the detected secondary electrons to the control device 30. This information is information indicating the number of the secondary electrons.

The EDS detector 17 detects X-rays generated from the sample S when the sample S is irradiated with an electron beam B2. The X-rays generated from the sample S include characteristic X-rays that are characteristic of respective substances constituting the sample S. The cross section observing apparatus 1 can determine substances constituting the sample S using these characteristic X-rays. The EDS detector 17 outputs a signal containing information indicating the detected X-rays to the control device 30.

The EBSD detector 18 detects an intensity distribution (diffraction figure) of secondary electrons that are generated from a cross section of a sample S made of a crystalline material by electron beam back scattering diffraction, that is, an EBSD pattern. When an electron beam B2 is applied to the cross section of the sample S. These secondary electrons are scattered electrons etc. that are scattered by the electron beam among the electrons included in the sample S. The EBSD pattern generated from the cross section represents a crystal structure (e.g., crystal system, crystal orientation, etc.) of the cross section. The cross section observing apparatus 1 can determine a chemical composition of the cross section using the EBSD pattern. The EBSD detector 18 outputs a signal containing information indicating the detected EBSD pattern to the control device 30.

The charged particle microscope 10 is connected to the control device 30 in a communicable manner by a cable. Thus, each of the focused ion beam column 11, the electron beam column 12 (including the above-mentioned intracolumn reflection electron detector), the stage 14, the secondary electron detector 16, the EDS detector 17, and the EBSD detector 18, which are provided in the charged particle microscope 10, operates on the basis of a control signal obtained from the control device 30. Wired communication via the cable is performed according to a standard such as Ethernet (registered trademark) or USB (Universal Serial Bus). An alternative configuration is possible in which the charged particle microscope 10 is connected to the control device 30 by wireless communication that is performed according to a communication standard such as Wi-Fi (registered trademark).

The charged particle microscope 10 may be configured so as not to be equipped with one of the above-mentioned intracolumn reflection electron detector, the secondary electron detector 16, the EDS detector 17, and the EBSD detector 18. Furthermore, the charged particle microscope 10 may be configured so as to be equipped with another detector in place of one of the intracolumn reflection electron detector, the secondary electron detector 16, the EDS detector 17, and the EBSD detector 18. Still further, the charged particle microscope 10 may be configured so as to be equipped with two or more other detectors in place of all of the intracolumn reflection electron detector, the secondary electron detector 16, the EDS detector 17, and the EBSD detector 18.

For example, the control device 30 is an information processing device such as a desktop PC (personal computer), a notebook PC, or a workstation. Instead, the control device 30 may be another type of information processing device such as a tablet PC, a multifunctional cellphone (smartphone or a PDA (personal data assistant).

The control device 30 controls the charged particle microscope 10. By controlling the charged particle microscope 10, the control device 30 causes the sample S to be irradiated with a charged particle beam and thereby exposes a cross section of the sample S. Furthermore, the control device 30 cause the charged particle microscope 10 to apply a charged particle beam to that cross section. The control device 30 causes the charged particle microscope 10 to detect secondary particles that are generated from the cross section resultantly. The control device 30 obtains, as sectional image information representing the cross section, a signal containing information including the secondary particles detected by the charged particle microscope 10. The control device 30 generates a sectional image of the cross section represented by the sectional image information on the basis of the obtained sectional image information.

The control device 30 generates sectional images of plural respective cross sections of the sample S by repeating the above operation. The control device 30 generates a three-dimensional image by superimposing the obtained plural sectional images. The control device 30 outputs the generated three-dimensional image to the display device 35 and causes it to display the three-dimensional image.

The control device 30 can perform other kinds of processing such as processing of forming, on a surface of the sample S, a deposition film for protecting the surface by means of the charged particle microscope 10. However, in the following, descriptions of kinds of processing performed by the control device 30 other than kinds of processing that are necessary for description of sectional image information obtaining processing and three-dimensional image display processing will be omitted.

For example, the display device 35 is a display that is equipped with, as the above-mentioned display unit, a liquid crystal display panel or an organic EL (electroluminescence) display panel. The display device 35 displays, on the display unit, various images obtained from the control device 30.

<Sectional Image Information Obtaining Processing Performed by Control Device>

The sectional image information obtaining processing performed by the control device 30 will be described below. As described above, the control device 30 controls the charged particle microscope 10 by performing sectional image information obtaining processing that is suitable for each of the plurality of observation conditions and thereby obtains sectional image information that corresponds to each of the plurality of observation conditions and represents a cross section of the sample S. In the following, a description will be made of an example case that the control device 30 controls the charged particle microscope 10 by performing sectional image information obtaining processing that is suitable for each of three observation conditions, that is, the SEM image observation conditions, the BSE image observation conditions, and the EDS map observation conditions, and thereby obtains sectional image information that corresponds to each of these three observation conditions and represents a cross section of the sample S. In the following, sectional image information obtaining processing that is suitable for each of the three observation conditions will be described for an example case that the charged particle microscope 10 irradiates a certain cross section XS of the sample S with a charged particle beam.

In scanning the above-mentioned irradiation region with an electron beam B2, the control device 30 specifies, in predetermined order, as first irradiation positions, plural positions in the XY plane of a first three-dimensional local coordinate system (or first two-dimensional local coordinate system) that is a preset coordinate system and serves to indicate a position in the irradiation region and causes the electron beam column 12 to irradiate the specified first irradiation positions with the electron beam B2. In this manner, the control device 30 has the irradiation region scanned with the electron beam B2.

First, SEM image information obtaining processing which is sectional image information obtaining processing performed under the SEM image observation conditions among the three observation conditions will be described. The control device 30 causes the electron beam column 12 to scan the irradiation region with an electron beam B2 by controlling the electron beam column 12 as performing the SEM image information obtaining processing. At this time, the sample S whose cross section XS is exposed is set in the irradiation region. Thus, the cross section XS of the sample S is scanned with the electron beam B2.

The control device 30 performs first signal obtaining processing while causing the electron beam column 12 to scan the irradiation region with the electron beam B2. When a certain, first irradiation position is irradiated with the electron beam B2, in the first signal obtaining processing the control device 30 obtains, from the secondary electron detector 16, a signal containing information indicating secondary electrons generated at the first irradiation position and detected by the secondary electron detector 16. The control device 30 puts, in a SEM image information table that is stored in the control device 30 in advance, information in which first irradiation position information indicating the specified first irradiation position, cross section information indicating the cross section XS of the sample S, and the information contained in the obtained signal are correlated with each other. The control device 30 puts such information in the SEM image information table repeatedly while the irradiation region is scanned with the electron beam B2. That is, SEM image information is information that is put in the SEM image information table in this manner.

Next, BSE image information obtaining processing which is sectional image information obtaining processing performed under the BSE image observation conditions among the three observation conditions will be described. The control device 30 causes the electron beam column 12 to scan the irradiation region with an electron beam B2 by controlling the electron beam column 12 as performing the BSE image information obtaining processing. At this time, the sample S whose cross section XS is exposed is set in the irradiation region. Thus, the cross section XS of the sample S is scanned with the electron beam B2.

The control device 30 performs second signal obtaining processing while causing the electron beam column 12 to scan the irradiation region with the electron beam B2. When a certain, first irradiation position is irradiated with the electron beam B2, in the second signal obtaining processing, the control device 30 obtains, from the intracolumn reflection electron detector, a signal containing information indicating secondary electrons generated at the first irradiation position and detected by the intracolumn reflection electron detector. The control device 30 puts, in a BSE image information table that is stored in the control device 30 in advance, information in which first irradiation position information indicating the specified first irradiation position, cross section information indicating the cross section XS of the sample S, and information correlated with the information contained in the obtained signal. The control device 30 puts such information in the BSE image information table repeatedly while the irradiation region is scanned with the electron beam B2. That is, BSE image information is information that is put in the BSE image information table in this manner.

Next, EDS map information obtaining processing which is sectional image information obtaining processing performed under the EDS map observation conditions among the three observation conditions will be described. The control device 30 causes the electron beam column 12 to scan the irradiation region with an electron beam B2 by controlling the electron beam column 12 by performing the EDS map information obtaining processing. At this time, the sample S whose cross section XS is exposed is set in the irradiation region. Thus, the cross section XS of the sample S is scanned with the electron beam B2.

The control device 30 performs third signal obtaining processing while causing the electron beam column 12 to scan the irradiation region with the electron beam B2. When a certain, first irradiation position is irradiated with the electron beam B2, in the third signal obtaining processing the control device 30 obtains, from the EDS detector 17, a signal containing information indicating X-rays detected by the EDS detector 17. The control device 30 puts, in an EDS map information table that is stored in the control device 30 in advance, information in which first irradiation position information indicating the specified first irradiation position, cross section information indicating the cross section XS of the sample S, and information correlated with the information contained in the obtained signal. The control device 30 puts such information in the EDS map information table repeatedly while the irradiation region is scanned with the electron beam B2. That is, EDS map information is information that is put in the EDS map information table in this manner.

<Etching Processing Performed by Control Device>

In causing the focused ion beam column 11 to scan the irradiation region with a focused ion beam B1, the control device 30 specifies, in predetermined order, as second irradiation positions, plural positions in the XY plane of a second three-dimensional local coordinate system (or second two-dimensional local coordinate system) that is a preset coordinate system and serves to indicate a position in the irradiation region and causes the focused ion beam column 11 to irradiate the specified second irradiation positions with the focused ion beam B1. In this manner, the control device 30 causes the focused ion beam column 11 to scan the irradiation region with the focused ion beam B1. At this time, the sample S whose cross section XS is exposed is set in the irradiation region. Thus, the cross section XS of the sample S is scanned with the focused ion beam B1.

The control device 30 performs etching processing, that is, causes the focused ion beam column 11 to etch the surface of the sample S that is set on the top surface of the stage 14 by scanning the second irradiation region with such a focused ion beam B1 in the above-described manner.

In performing the etching processing, the control device 30 sets the energy of the focused ion beam B1 to be emitted from the focused ion beam column 11 higher than or equal to energy that enables etching of the surface of the sample S. With this etching, the control device 30 can expose a cross section of the sample S.

<Hardware Configuration of Control Device>

Figure 2:
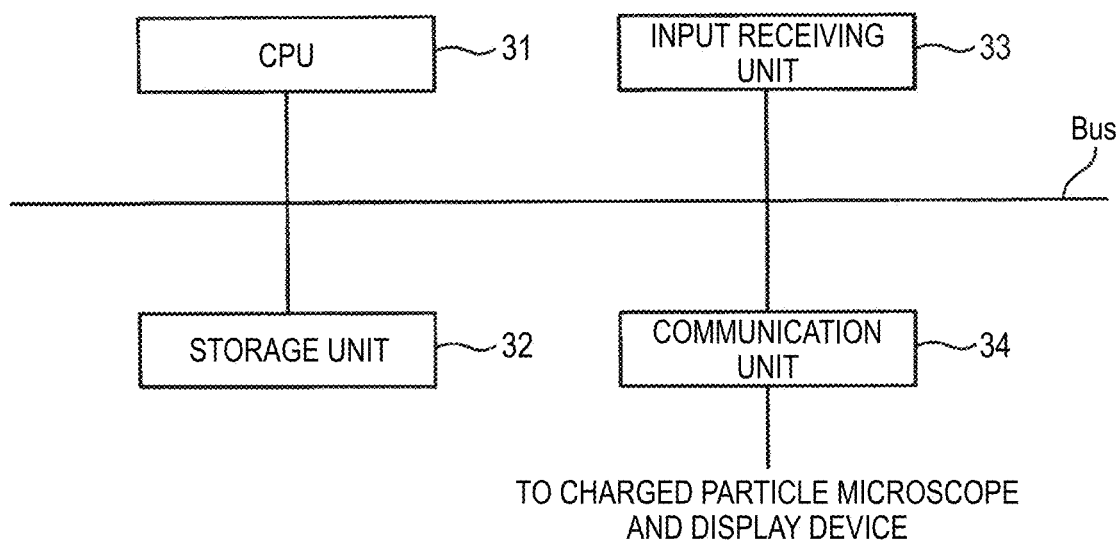
FIG. 2 shows an example of a hardware configuration of a control device 30.

A hardware configuration of the control device 30 will be described below with reference to FIG. 2. FIG. 2 shows an example hardware configuration of the control device 30.

For example, the control device 30 is equipped with a CPU (central processing unit) 31, a storage unit 32, an input receiving unit 33, and a communication unit 34. These constituent elements are connected to each other in a communicable manner via a bus (Bus). The control device 30 communicates with each of the charged particle microscope 10 and the display device 35 through the communication unit 34.

The CPU 31 runs various kinds of programs stored in the storage unit 32.

For example, the storage unit 32 includes an HDD (hard disk drive) or an SSD (solid-state drive), an EEPROM (electrically erasable programmable read-only memory), a ROM (read-only memory), a RAM (random access memory), etc. Instead of being incorporated in the control device 30, the storage unit 32 may be an external storage device that is connected via, for example, a digital input/output port of USB or the like. The storage unit 32 stores various kinds of information and images to be processed by the control device 30 and various programs.

For example, the input receiving unit 33 is an input device such as a keyboard and a mouse or a touch pad. Where the control device 30 and the display device 35 are integrated with each other, the input receiving unit 33 may be another type of input device that is integrated with a display unit of the display device 35, such as a touch panel.

For example, the communication unit 34 is configured so as to include a digital input/output port of USB or the like or an Ethernet (registered trademark) port.

<Functional Configuration of Control Device>

Figure 3:
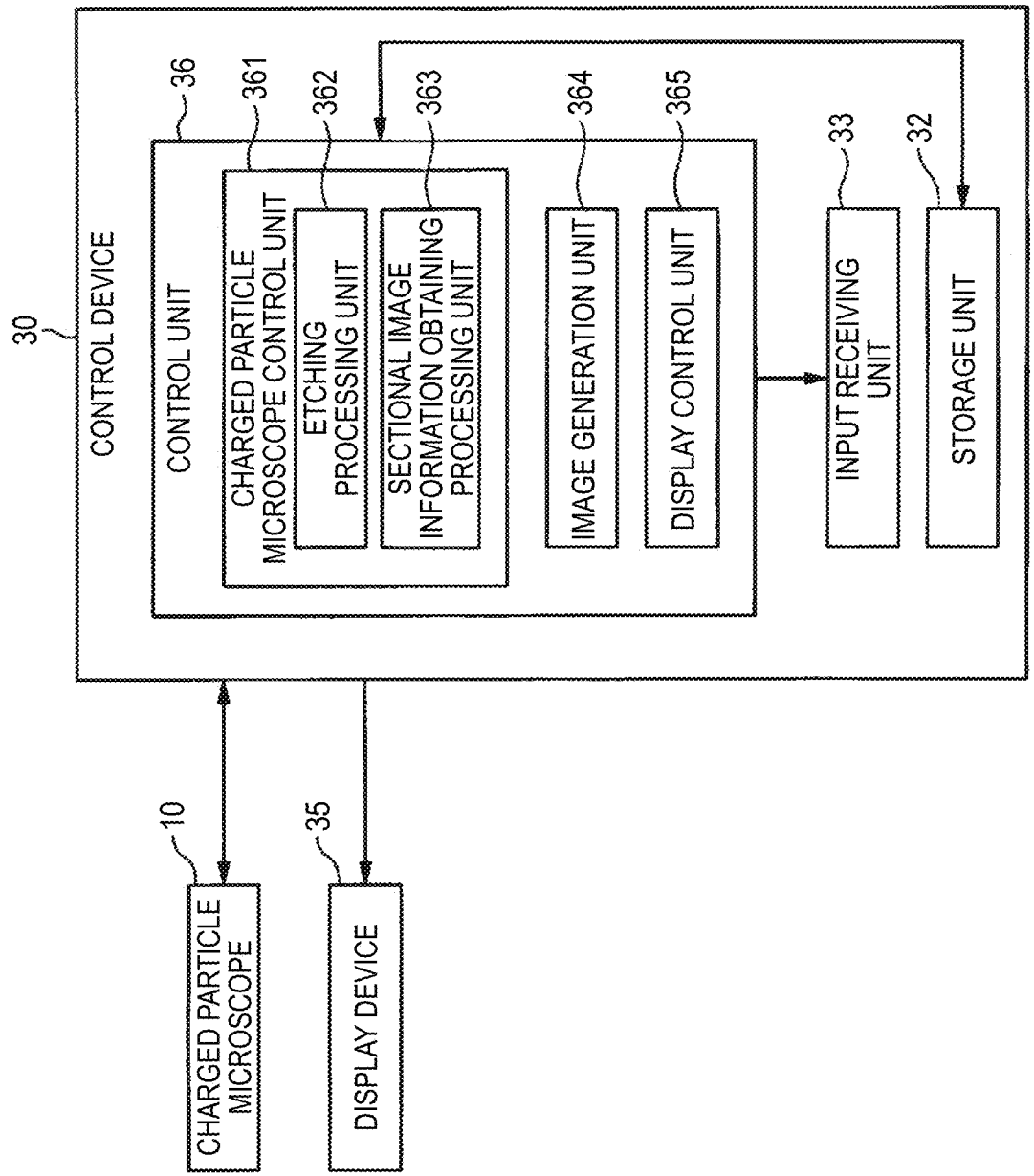
FIG. 3 shows an example of a functional configuration of the control device 30.

The functional configuration of the control device 30 will be described below with reference to FIG. 3. FIG. 3 shows an example of a functional configuration of the control device 30.

The control device 30 is equipped with a storage unit 32, an input receiving unit 33, and a control unit 36.

The control unit 36 controls the entire control device 30. The control unit 36 is equipped with a charged particle microscope control unit 361, an image generation unit 364, and a display control unit 365. These functional units of the control unit 36 are implemented by the CPU 31's running various programs stored in the storage unit 32. All or part of these functional units may be hardware functional units such as an LSI (large scale integration) or an ASIC (application-specific integrated circuit).

The charged particle microscope control unit 361 controls the entire charged particle microscope 10. For example, the charged particle microscope control unit 361 is equipped with an etching processing unit 362 and a sectional image information obtaining processing unit 363.

The etching processing unit 362 performs the above-described etching processing by controlling the charged particle microscope 10.

The sectional image information obtaining processing unit 363 performs sectional image information obtaining processing under each of the plurality of observation conditions by controlling the charged particle microscope 10.

The image generation unit 364 generates sectional images of cross sections of the sample S on the basis of pieces of sectional image information stored in the storage unit 32. For example, the image generation unit 364 generates SEM images of cross sections of the sample S on the basis of pieces of SEM image information that are written in the SEM image information table stored in the storage unit 32. The image generation unit 364 generates a three-dimensional SEM image on the basis of the generated SEM images of the cross sections. Furthermore, the image generation unit 364 generates BSE images of cross sections of the sample S on the basis of BSE image information that is written in the BSE image information table stored in the storage unit 32. The image generation unit 364 generates a three-dimensional BSE image on the basis of the generated BSE images of the cross sections. Still further, the image generation unit 364 generates an EDS map of cross sections of the sample S on the basis of EDS map information that is written in the EDS map information table stored in the storage unit 32. The image generation unit 364 generates a three-dimensional EDS map on the basis of the generated EDS map of the cross sections.

The display control unit 365 generates various kinds of pictures to be displayed on the display unit of the display device 35. The display control unit 365 outputs a generated picture to the display device 35 and has it display the picture on its display unit. For example, the display control unit 365 causes display, on the display unit, of all or part of a three-dimensional SEM image, a three-dimensional BSE image, and a three-dimensional EDS map generated by the image generation unit 364 according to operations received from the user.

<Process, Executed by Cross Section Observing Apparatus, for Obtaining Sectional Image Information of Each Cross Section of Sample>

Figure 4:
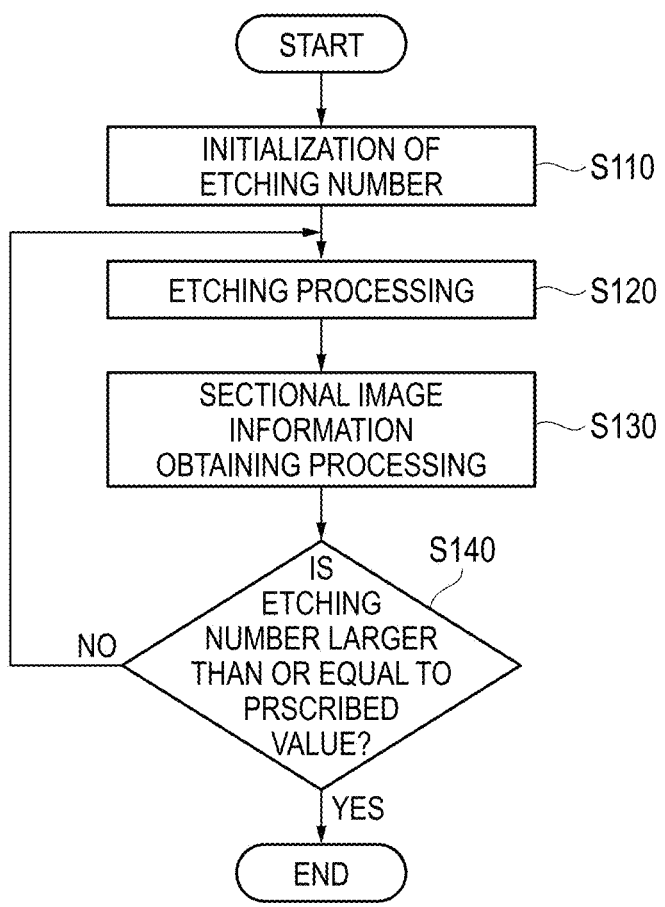
FIG. 4 is a flowchart showing an example flow of a process that the cross section observing apparatus 1 obtains pieces of sectional image information of cross sections of a sample S by performing sectional image information obtaining processing under each of three observation conditions.

A process that the cross section observing apparatus 1 obtains pieces of sectional image information of cross sections of the sample S by performing sectional image information obtaining processing under each of the three observation conditions will be described below with reference to FIG. 4. FIG. 4 is a flowchart showing an example flow of the process that the cross section observing apparatus 1 obtains pieces of sectional image information of cross sections of the sample S by performing sectional image information obtaining processing under each of the three observation conditions.

The etching processing unit 362 generates, in the storage unit 32, a variable for storage of an etching number that is the number of times etching processing has been performed at step S120. Then the etching processing unit 362 initializes this variable generated in the storage unit 32 to zero (step S110). That is, the etching processing unit 362 initializes the etching number to zero. The etching processing unit 362 may be configured so as to initialize this variable to a numerical value other than zero. As a further alternative, the etching processing unit 362 may be configured so as to generate, as the variable, in the storage unit 32, a variable for storage of a character string, a symbol, or the like representing an etching number.

Subsequently, the etching processing unit 362 etches the surface of the sample S by performing the above-described etching processing by controlling the focused ion beam column 11 (step S120). Then the etching processing unit 362 increments, by one, the value of the variable for storage of the etching number stored in the storage unit 32.

Subsequently, the sectional image information obtaining processing unit 363 performs sectional image information obtaining processing under each of the three observation conditions by controlling the electron beam column 12 and thereby obtains sectional image information corresponding to each of the three observation conditions (step S130). More specifically, first, the sectional image information obtaining processing unit 363 stores SEM image information in the SEM image information table by performing SEM image information obtaining processing under the SEM image observation conditions. While performing the SEM image information obtaining processing or after completion of it, the sectional image information obtaining processing unit 363 performs BSE image information obtaining processing (performed under the BSE image observation conditions) and EDS map information obtaining processing (performed under the EDS image observation conditions) in parallel.

Where these three kinds of sectional image information obtaining processing are performed in parallel, the sectional image information obtaining processing unit 363 obtains SEM image information, BSE image information, and EDS map information in parallel by scanning the irradiation region once with an electron beam B2. The sectional image information obtaining processing unit 363 may be configured so as to perform SEM image information obtaining processing for at least part of plural occasions of execution of step S120. In this case, the image generation unit 364 generates SEM images representing at least part of plural cross sections of the sample S exposed by repeated execution of the processing of step S120, respectively. The sectional image information obtaining processing unit 363 may be configured so as to perform BSE image information obtaining processing for at least part of the plural occasions of execution of step S120. In this case, the image generation unit 364 generates BSE images representing at least part of the plural cross sections of the sample S exposed by the repeated execution of the processing of step S120, respectively. The sectional image information obtaining processing unit 363 may be configured so as to perform EDS map information obtaining processing for at least part of the plural occasions of execution of step S120. In this case, the image generation unit 364 generates EDS maps representing at least part of the plural cross sections of the sample S exposed by the repeated execution of the processing of step S120, respectively. In the following, an example case that SEM image information obtaining processing, BSE image information obtaining processing, and EDS map information obtaining processing are performed every time step S120 is executed.

Each of SEM image information, BSE image information, and EDS map information obtained at step S130 contains cross section information representing a cross section exposed by etching processing of step S120. The sectional image information obtaining processing unit 363 uses, as the cross section information, information indicating an etching number stored in the storage unit 32 as the variable for storage of the etching number. That is, each of SEM image information, BSE image information, and EDS map information obtained at step S130 contains, as cross section information, information indicating an etching number. Alternatively, the sectional image information obtaining processing unit 363 may be configured so as to use, as the cross section information, another kind of information.

The sectional image information obtaining processing unit 363 stores pieces of SEM image information, pieces of BSE image information, and pieces of EDS map information written in the SEM image information table, the BSE image information table, and the EDS map information table (stored in the storage unit 32), respectively, in the storage unit 32 in such a manner that they are correlated with respective pieces of cross section information. That is, the sectional image information obtaining processing unit 363 stores the SEM image information table, the BSE image information table, and the EDS map information table in the storage unit 32 in such a manner that pieces of information stored in each of them are grouped according to the cross section information. With this measure, the cross section observing apparatus 1 can shorten the time taken to perform three-dimensional image display processing (described later). Alternatively, the sectional image information obtaining processing unit 363 may be configured in such a manner that pieces of SEM image information, pieces of BSE image information, and pieces of EDS map information are stored in the storage unit 32 so as not to be correlated with respective pieces of cross section information.

Subsequently, the etching processing unit 362 judges whether the etching number stored as the variable for storage of the etching number in the storage unit 32 is larger than or equal to a prescribed value (step S140). If judging that the etching number is smaller than the prescribed value (step S140: no), the etching processing unit 362 makes a transition to step S120, where it etches the surface of the sample by performing etching processing again. On the other hand, if the etching processing unit 362 judges that the etching number is larger than or equal to the prescribed value (step S140: yes), the charged particle microscope control unit 361 finishes the process. The prescribed value is a value that is determined according to a number of times the user wants to etch the sample to obtain a cross section. The prescribed value is input to the etching processing unit 362 by the user in advance.

As described above, by executing steps S110-S140 repeatedly, the cross section observing apparatus 1 can store, in the storage unit 32, pieces of SEM image information, pieces of BSE image information, and pieces of EDS map information of respective cross sections of the sample S exposed by a focused ion beam B1.

<Three-Dimensional Image Display Process Executed by Cross Section Observing Apparatus>

Figure 5:
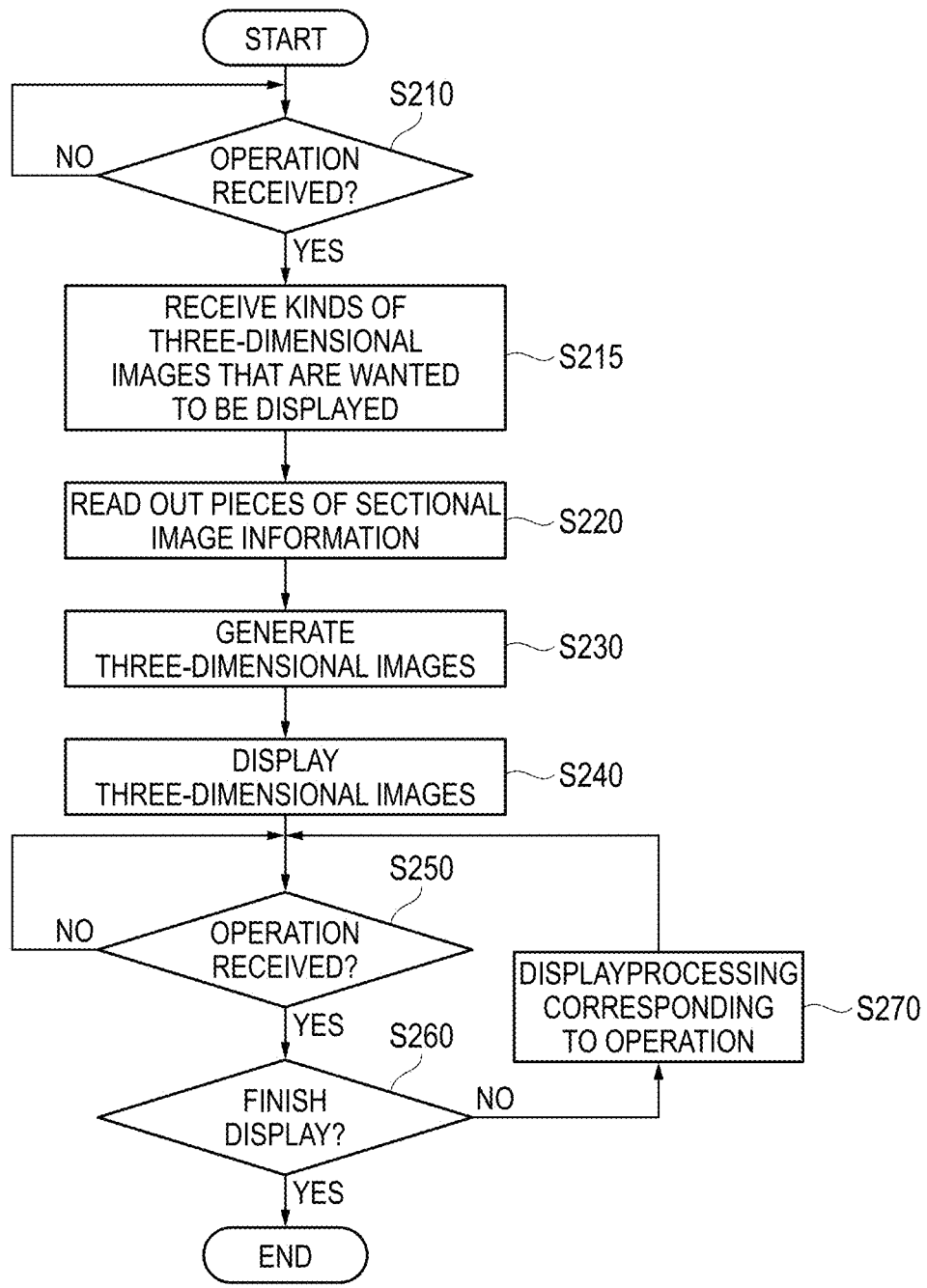
FIG. 5 is a flowchart showing an example flow of a three-dimensional image display process executed by the cross section observing apparatus 1.

A three-dimensional image display process executed by the cross section observing apparatus 1 will be described below with reference to FIG. 5. FIG. 5 is a flowchart showing an example flow of the three-dimensional image display process executed by the cross section observing apparatus 1. In the following, an example case that the flowchart of FIG. 5 is started after completion of the process of the flowchart of FIG. 4. Incidentally, the process of the flowchart of FIG. 5 may be started in the midst of execution of the process of the flowchart of FIG. 4. In this case, pieces of SEM image information, pieces of BSE image information, and pieces of EDS map information used in the process of the flowchart of FIG. 5 are pieces of SEM image information, pieces of BSE image information, or pieces of EDS map information that are stored in the SEM image information table, the BSE image information table, and the EDS map information table, respectively, at the time of the start of the process of the flowchart of FIG. 5.

The image generation unit 364 waits until receiving an operation for starting the three-dimensional image display process from the user (step S210). For example, the image generation unit 364 receives the operation for starting the three-dimensional image display process from the user through an operation picture that is displayed on the display unit of the display device 35 in advance by the display control unit 365.

Subsequently, the image generation unit 364 receives one or more kinds of three-dimensional images that the user wants to display among the kinds of three-dimensional images that can be displayed by the cross section observing apparatus 1 (step S215). In this example, the kinds of three-dimensional images that can be displayed by the cross section observing apparatus 1 are three kinds, that is, the three-dimensional SEM image, the three-dimensional BSE image, and the three-dimensional EDS map. The image generation unit 364 receives one or more kinds of three-dimensional images from the user through a kind selection picture that is displayed on the display unit of the display device 35 in advance by the display control unit 365. An example case that the image generation unit 364 receives three kinds, that is, the three-dimensional SEM image, the three-dimensional BSE image, and the three-dimensional EDS map, from the user at step S215 will be described below.

Subsequently, the image generation unit 364 reads out, from the storage unit 32, pieces of sectional image information that are necessary to generate three-dimensional images of the kinds received at step S215 (step S220). More specifically, if the kinds received at step S215 include the three-dimensional SEM image, the image generation unit 364 reads out pieces of SEM image information that are written in the SEM image information table stored in the storage unit 32. If the kinds received at step S215 include the three-dimensional BSE image, the image generation unit 364 reads out pieces of BSE image information that are written in the BSE image information table stored in the storage unit 32. If the kinds received at step S215 include the three-dimensional EDS map, the image generation unit 364 reads out pieces of EDS map information that are written in the EDS image information table stored in the storage unit 32. In this example, since each of the three-dimensional SEM image, the three-dimensional BSE image, and the three-dimensional EDS map was selected at step S215, the image generation unit 364 reads out pieces of SEM image information written in the SEM image information table, pieces of BSE image information written in the BSE image information table, and pieces of EDS map information written in the EDS map information table.

Subsequently, the image generation unit 364 generates three-dimensional images on the basis of the sets of pieces of sectional image information that were read out at step S220 (step S230). Step S230 will be described below.

Upon reading out pieces of SEM image information from the SEM image information table at step S220, the image generation unit 364 generates SEM images on the basis of the respective read-out pieces of SEM image information. More specifically, the image generation unit 364 determines sets of pieces of information correlated with same cross section information, that is, pieces of information indicating secondary electrons and pieces of first irradiation position information, on the basis of the cross section information contained in each piece of SEM image information. Then the image generation unit 364 generates a SEM image of the cross section concerned on the basis of the thus-determined sets of pieces of information, that is, the pieces of information concerned and the pieces of first irradiation position information of the cross section indicated by the cross section information. The method for generating a SEM image of each cross section on the basis of the pieces of information concerned and the pieces of first irradiation position information of the cross section may be either a known method or a method to be developed in the future.

For example, the image generation unit 364 determines sets of pieces of information correlated with cross section information indicating a certain cross section XS of the sample S, that is, pieces of information indicating secondary electrons and pieces of first irradiation position information, among pieces of SEM image information that were read out from the SEM image information table at step S220. Furthermore, the image generation unit 364 generates an image representing the above-mentioned irradiation region in a storage area of the storage unit 32. Individual points of the image represent positions in the irradiation region and in the XY coordinate plane of the above-mentioned first three-dimensional local coordinate system. A height corresponding to the etching number indicated by the cross section information is correlated with the image. In this example, when the etching number is equal to 1, the height corresponding to the etching number indicated by the cross section information is a reference height (e.g., 0). That is, the height corresponding to the etching number indicated by the cross section information means the height that increases as the position goes from the top surface of the sample S to its bottom surface. In this example, when the etching number is equal to n (n: integer that is larger than or equal to 2), the height corresponding to the etching number indicated by the cross section information means a height that is equal to n times a slice width that is a predetermined thickness by which the surface of the sample S is removed by one-time etching processing. Thus, individual points of the image represent three-dimensional positions.

The image generation unit 364 correlates, with each point of the generated image, information indicating secondary electrons and correlated with first irradiation position information including information indicating a position represented by the point among the determined pieces of first irradiation position information, and sets the pixel values of the pixel at pixel values (e.g., a hue value, a lightness value, a luminance value, etc.) corresponding to the above information. In this manner, the image generation unit 364 generates this image as a SEM image of the cross section XS. The image generation unit 364 generates SEM images for the respective cross sections by generating a SEM image in the above-described manner for each cross section indicated by cross section information included in each piece of SEM image information that was read out from the SEM image information table.

Furthermore, the image generation unit 364 generates a three-dimensional SEM image by superimposing the generated SEM images. More specifically, the image generation unit 364 generates a three-dimensional SEM image by superimposing the SEM images of the respective cross sections indicated by the pieces of cross section information included in the respective pieces of SEM image information that were read out from the SEM image information table, in ascending order of the heights correlated with the respective SEM images. The method for generating a three-dimensional SEM image may be either a known method or a method to be developed in the future.

Upon reading out pieces of BSE image information from the BSE image information table at step S220, the image generation unit 364 generates BSE images on the basis of the respective read-out pieces of BSE image information. More specifically, the image generation unit 364 determines sets of pieces of information correlated with same cross section information, that is, pieces of information indicating secondary electrons and pieces of first irradiation position information, on the basis of the cross section information contained in each piece of BSE image information. Then the image generation unit 364 generates a BSE image of the cross section concerned on the basis of the thus-determined sets of pieces of information, that is, the pieces of information concerned and the pieces of first irradiation position information of the cross section indicated by the cross section information. The method for generating a BSE image on the basis of the pieces of information concerned and the pieces of first irradiation position information may be either a known method or a method to be developed in the future.

For example, the image generation unit 364 determines sets of pieces of information correlated with cross section information indicating a certain cross section XS of the sample S, that is, pieces of information indicating secondary electrons and pieces of first irradiation position information, among pieces of BSE image information that were read out from the BSE image information table at step S220. Furthermore, the image generation unit 364 generates an image representing the irradiation region in a storage area of the storage unit 32. Individual points of the image represent positions in the irradiation region and in the XY coordinate plane of the first three-dimensional local coordinate system. A height corresponding to the etching number indicated by the cross section information is correlated with the image. Thus, individual points of the image represent three-dimensional positions. The image generation unit 364 correlates, with each point of the generated image, information indicating secondary electrons and correlated with first irradiation position information including information indicating a position represented by the point among the determined pieces of first irradiation position information, and sets the pixel values of the pixel at pixel values (e.g., a hue value, a lightness value, a luminance value, etc.) corresponding to the above information. In this manner, the image generation unit 364 generates this image as a BSE image of the cross section XS. The image generation unit 364 generates BSE images for the respective cross sections by generating a BSE image in the above-described manner for each cross section indicated by cross section information included in each piece of BSE image information that was read out from the BSE image information table.

Furthermore, the image generation unit 364 generates a three-dimensional BSE image by superimposing the generated SEM images of the respective cross sections of the sample S. More specifically, the image generation unit 364 generates a three-dimensional BSE image by superimposing the BSE images of the respective cross sections in ascending order of the heights correlated with the respective BSE images. The method for generating a three-dimensional BSE image may be either a known method or a method to be developed in the future.

Upon reading out pieces of EDS map image information from the EDS map image information table at step S220, the image generation unit 364 generates EDS map images on the basis of the respective read-out pieces of EDS map image information. More specifically, the image generation unit 364 determines sets of pieces of information correlated with same cross section information, that is, pieces of information indicating X-rays and pieces of first irradiation position information, on the basis of the cross section information contained in each piece of EDS map image information. Then the image generation unit 364 generates an EDS map of the cross section concerned on the basis of the thus-determined sets of pieces of information, that is, the pieces of information concerned and the pieces of first irradiation position information of the cross section indicated by the cross section information. The method for generating an EDS map on the basis of the pieces of information concerned and the pieces of first irradiation position information of each cross section may be either a known method or a method to be developed in the future.

For example, the image generation unit 364 determines sets of pieces of information correlated with cross section information indicating a certain cross section XS of the sample S, that is, pieces of information indicating-rays and pieces of first irradiation position information, among pieces of EDS map information that were read out from the EDS map image information table at step S220. Furthermore, the image generation unit 364 generates an image representing the above-mentioned irradiation region in a storage area of the storage unit 32. Individual points of the image represent positions in the irradiation region and in the XY coordinate plane of the first three-dimensional local coordinate system. A height corresponding to the etching number indicated by the cross section information is correlated with the image. The image generation unit 364 correlates, with each point of the generated image, information indicating X-rays and correlated with first irradiation position information including information indicating a position represented by the point among the determined pieces of first irradiation position information, and sets the pixel values of the pixel at pixel values (e.g., a hue value, a lightness value, a luminance value, etc.) corresponding to the above information. The image generation unit 364 generates EDS maps for the respective cross sections by generating an EDS map in the above-described manner for each cross section indicated by cross section information included in each piece of EDS map information that was read out from the EDS map information table.

Furthermore, the image generation unit 364 generates a three-dimensional EDS map by superimposing the generated EDS maps. More specifically, the image generation unit 364 generates a three-dimensional EDS map by superimposing the EDS map of the respective cross sections indicated by the pieces of cross section information included in the respective pieces of EDS map information that was read out from the EDS map information table, in ascending order of the heights correlated with the respective EDS maps. The method for generating a three-dimensional EDS map may be either a known method or a method to be developed in the future.

In this example, the image generation unit 364 reads out the pieces of SEM image information, the pieces of BSE image information, and the pieces of EDS map information from the storage unit 32 at step S220 and generates SEM images, BSE images, and EDS maps of the respective cross sections of the sample S. Then the image generation unit 364 generates a three-dimensional SEM image on the basis of the SEM images of the respective cross sections indicated by the pieces of cross section information contained in the respective pieces of SEM image information that were read out from the SEM image information table, generates a three-dimensional BSE image on the basis of the BSE images of the respective cross sections indicated by the pieces of cross section information contained in the respective pieces of BSE image information that were read out from the BSE image information table, and generates a three-dimensional EDS map on the basis of the EDS maps of the respective cross sections indicated by the pieces of cross section information contained in the respective pieces of EDS map information that were read out from the EDS information table.

Subsequently, the display control unit 365 displays the three-dimensional images generated at step S230 on the display unit of the display device 35 (step S240). More specifically, the display control unit 365 generates a three-dimensional image display picture in which to display the three-dimensional images. Then the display control unit 365 arranges the three-dimensional images at prescribed positions in the generated three-dimensional image display picture. The display control unit 365 causes the display unit to display the three-dimensional image display picture in which the three-dimensional images are arranged. In this example, since the image generation unit 364 generated the three-dimensional SEM image, the three-dimensional BSE image, and the three-dimensional EDS map at step S230, the display control unit 365 arranges the three-dimensional SEM image, the three-dimensional BSE image, and the three-dimensional EDS map in the three-dimensional image display picture.

Figure 6:
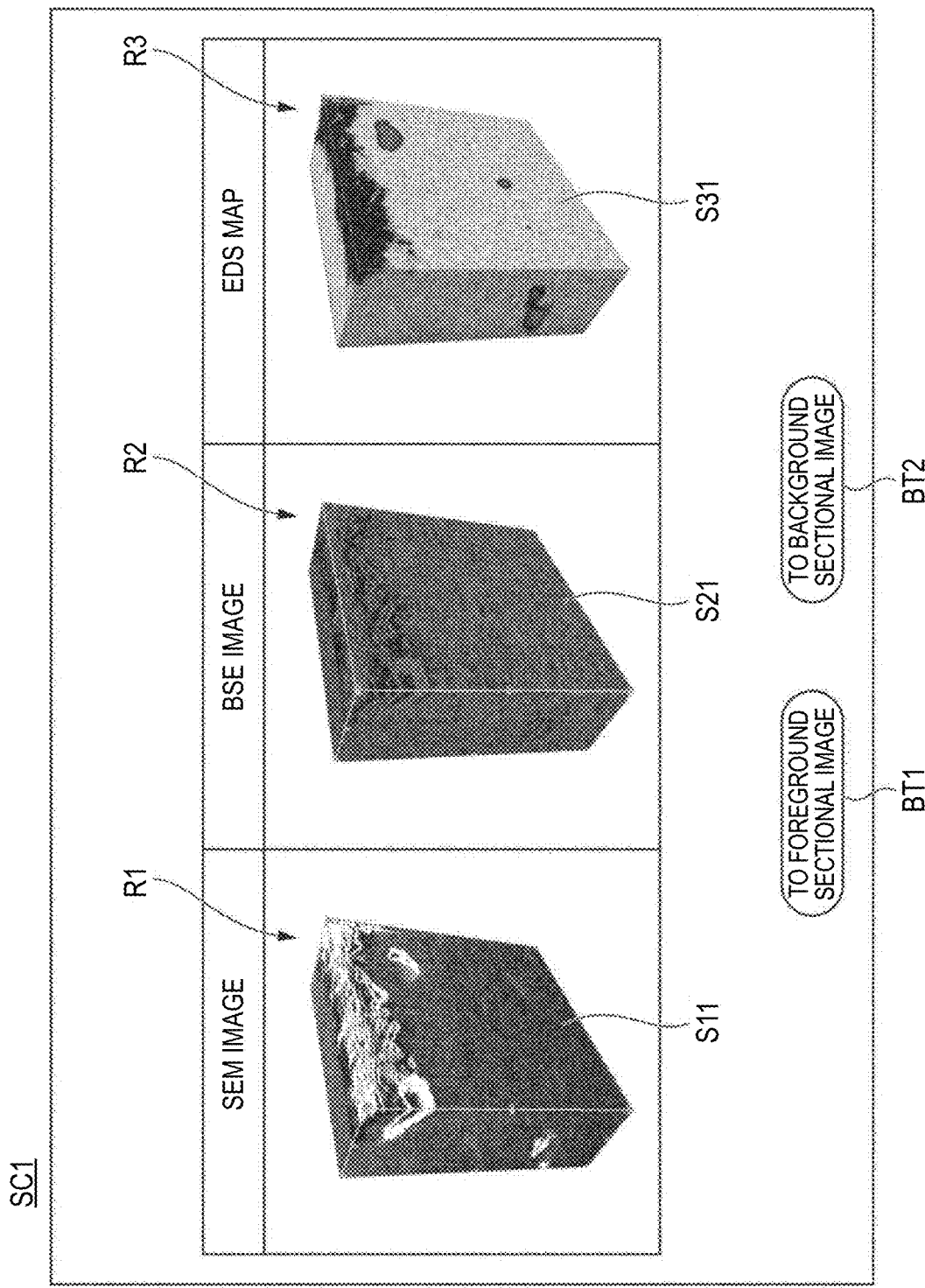
FIG. 6 shows an example of a three-dimensional image display picture that a display device 35 causes a display unit of the display control unit 365 to display at step S240.

FIG. 6 shows an example three-dimensional image display picture that the display control unit 365 causes the display unit of the display device 35 to display at step S240. A picture SC1 shown in FIG. 6 is an example three-dimensional image display picture that the display control unit 365 causes the display unit of the display control unit 365 to display at step S240. The display control unit 365 displays the three-dimensional SEM image, the three-dimensional BSE image, and the three-dimensional EDS map in the picture SC1 in such a manner that they do not overlap with each other. Thus, the picture SC1 includes a region R1 where to display the three-dimensional SEM image, a region R2 where to display the three-dimensional BSE image, and a region R3 where to display the three-dimensional EDS map.

In the example shown in FIG. 6, an example three-dimensional SEM image generated at step S230 is displayed in the region R1. An example three-dimensional BSE image generated at step S230 is displayed in the region R2. An example three-dimensional EDS map generated at step S230 is displayed in the region R3.

A three-dimensional coordinate system R1C for designation of positions in the region R1 is correlated with the region R1. As described above, individual points of the three-dimensional SEM image displayed in the region R1 correspond to respective three-dimensional positions in the first three-dimensional local coordinate system. That is, the first three-dimensional local coordinate system is correlated with the three-dimensional SEM image imaginarily. The position of the three-dimensional SEM image is represented by a position in the three-dimensional coordinate system R1C, that is, the position of the origin of the first three-dimensional local coordinate system which is correlated with the three-dimensional SEM image imaginarily. The posture of the three-dimensional SEM image is represented by directions in the three-dimensional coordinate system R1C, that is, the directions of the respective coordinate axes of the first three-dimensional local coordinate system.

A three-dimensional coordinate system R2C for designation of positions in the region R2 is correlated with the region R2. As described above, individual points of the three-dimensional BSE image displayed in the region R2 correspond to respective three-dimensional positions in the first three-dimensional local coordinate system. That is, the first three-dimensional local coordinate system is correlated with the three-dimensional BSE image imaginarily. The position of the three-dimensional BSE image is represented by a position in the three-dimensional coordinate system R2C, that is, the position of the origin of the first three-dimensional local coordinate system which is correlated with the three-dimensional BSE image imaginarily. The posture of the three-dimensional BSE image is represented by directions in the three-dimensional coordinate system R2C, that is, the directions of the respective coordinate axes of the first three-dimensional local coordinate system.

A three-dimensional coordinate system R3C for designation of positions in the region R3 is correlated with the region R3. As described above, individual points of the three-dimensional EDS map displayed in the region R3 correspond to respective three-dimensional positions in the first three-dimensional local coordinate system. That is, the first three-dimensional local coordinate system is correlated with the three-dimensional EDS map imaginarily. The position of the three-dimensional EDS map is represented by a position in the three-dimensional coordinate system R3C, that is, the position of the origin of the first three-dimensional local coordinate system which is correlated with the three-dimensional EDS map imaginarily. The posture of the three-dimensional EDS map is represented by directions in the three-dimensional coordinate system R3C, that is, the directions of the respective coordinate axes of the first three-dimensional local coordinate system.

Reference display positions as references of display of a three-dimensional image are set in the respective regions R1-R3. The display control unit 365 makes the reference display position of the region R1 coincide with the origin of the first three-dimensional local coordinate system which is correlated with the three-dimensional SEM image imaginarily. For example, the reference display position is the position of the center of the region R1. Alternatively, the reference display position may be another position in the region R1. The display control unit 365 makes the reference display position of the region R2 coincide with the origin of the first three-dimensional local coordinate system which is correlated with the three-dimensional BSE image imaginarily. For example, the reference display position is the position of the center of the region R2. Alternatively, the reference display position may be another position in the region R2. The display control unit 365 makes the reference display position of the region R3 coincide with the origin of the first three-dimensional local coordinate system which is correlated with the three-dimensional EDS map imaginarily. For example, the reference display position is the position of the center of the region R3. Alternatively, the reference display position may be another position in the region R3.

In displaying a three-dimensional SEM image in the region R1 for the first time, the display control unit 365 makes the posture of the three-dimensional SEM image coincide with a reference posture. In displaying a three-dimensional BSE image in the region R2 for the first time, the display control unit 365 makes the posture of the three-dimensional BSE image coincide with this reference posture. In displaying a three-dimensional EDS map in the region R3 for the first time, the display control unit 365 makes the posture of the three-dimensional EDS map coincide with this reference posture. That is, in displaying each of the three-dimensional SEM image, the three-dimensional BSE image, and the EDS map in the picture SC1 for the first time, the display control unit 365 displays each of the three-dimensional SEM image, the three-dimensional BSE image, and the EDS map so that its posture coincides with the same reference posture. With this measure, the display control unit 365 allows sectional images of a cross section represented by pieces of sectional image information obtained under different observation conditions to be compared with each other being seen from the same virtual direction.

After execution of step S240, the display control unit 365 waits until receiving an operation from the user (step S250). When receiving an operation from the user (Step S250: yes), the display device 35 judges whether the received operation is to finish the display of the three-dimensional images (step S260). If judging that the received operation is to finish the display of the three-dimensional images (step S260: yes), the display control unit 365 finishes the process. On the other hand, if judging that the received operation is not to finish the display of the three-dimensional images (step S260: no), the display control unit 365 performs display processing corresponding to the operation (step S270), thereafter makes a transition to step S250, and again waits until receiving the operation from the user.

A specific example of the processing performed at step S270 will be described below. If receiving, at step S250, an operation for changing the postures of the three-dimensional images displayed in the picture SC1 from the user through the picture SC1, the display control unit 365 changes the postures of the three-dimensional SEM image displayed in the region R1, the three-dimensional BSE image displayed in the region R2, and the EDS map displayed in the region R3 to postures corresponding to the operation.

Figure 7:
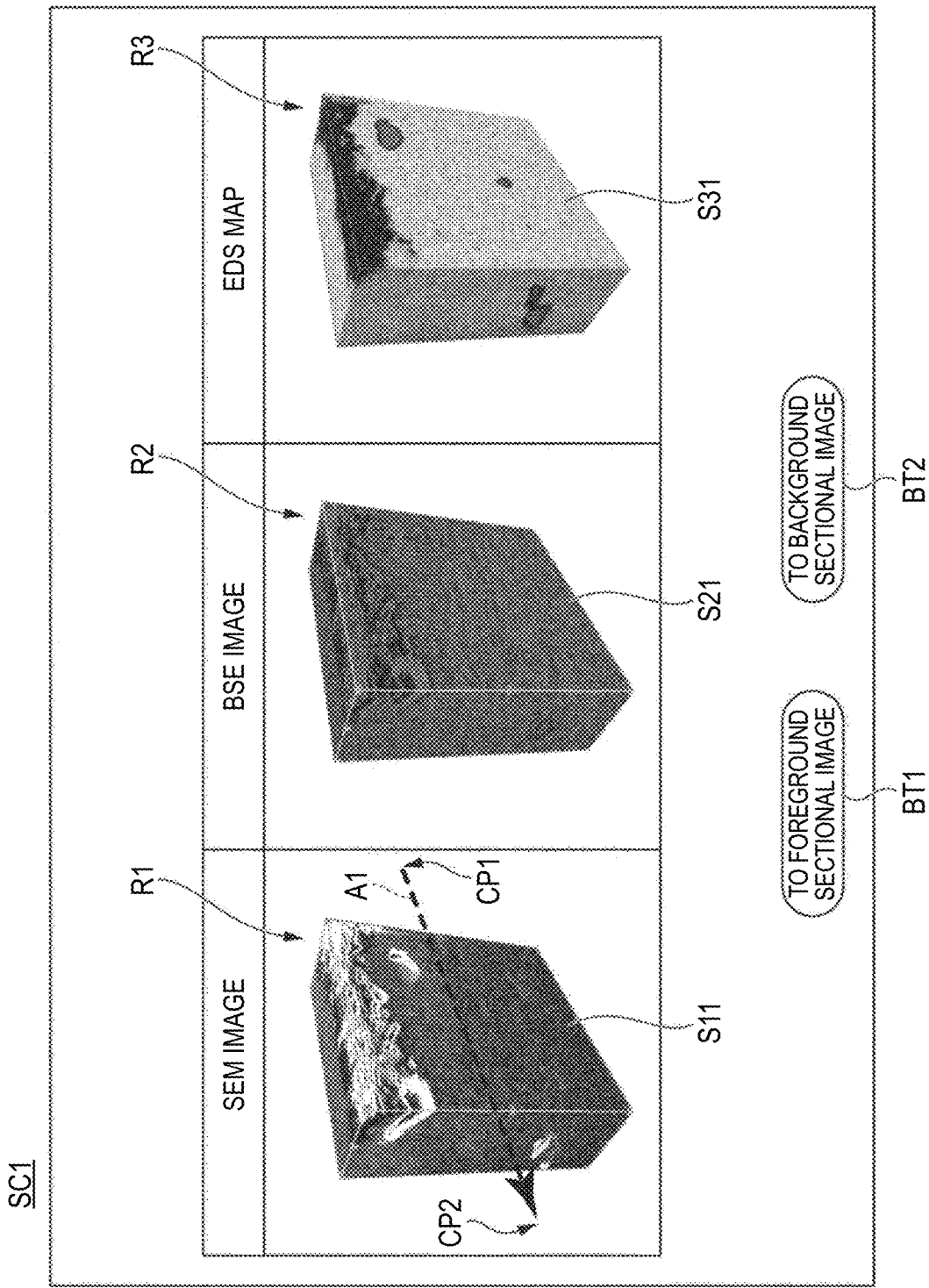
FIG. 7 is for description of a rotation operation to be performed in a picture SC1.

For example, if receiving an operation for changing the postures of the three-dimensional images displayed in the picture SC1 from the user through the picture SC1, the display control unit 365 changes the postures of the three-dimensional SEM image displayed in the region R1, the three-dimensional BSE image displayed in the region R2, and the EDS map displayed in the region R3 to postures corresponding to the operation by rotating them by a rotation angle corresponding to the operation about a rotation axis corresponding to the operation. For example, as shown in FIG. 7, the operation is an operation of moving a mouse cursor from a first position CP1 in the picture SC1 to a second position CP2 that is different from the first position CP1 while a prescribed one of one or more buttons of the mouse is kept pushed down. The mouse cursor is an image that is displayed on the display unit of the display device 35 and indicates a position pointed by the mouse among the positions on the display unit. When the display unit of the display device 35 is a touch panel, the rotation operation may be a touch operation such as a swipe operation using a finger, a stylus pen, or the like.

Figure 8:
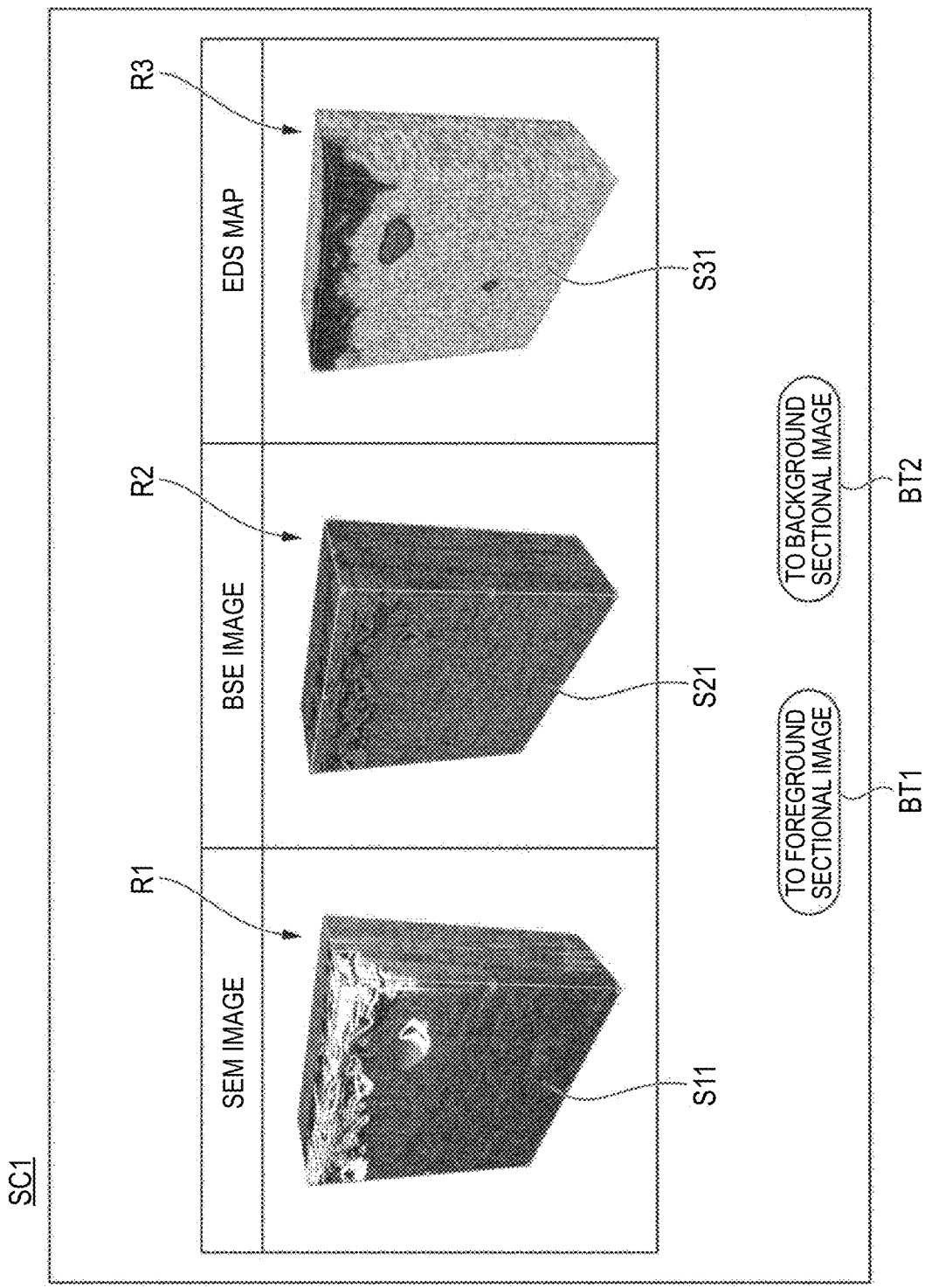
FIG. 8 shows an example state that is a result of processing of the display control unit 365's rotating a three-dimensional SEM image, a three-dimensional BSE image, and a three-dimensional EDS map shown in FIGS. 6 and 7 by a rotation angle corresponding to a rotation operation received from a user about a rotation axis corresponding to the rotation operation.

FIG. 7 is for description of a rotation operation to be performed in the picture SC1. As shown in FIG. 7, when the mouse cursor is moved from the first position CP1 in the picture SC1 to the second position CP2 that is different from the first position CP1 while the button of the mouse is kept pushed down, the display control unit 365 judges that an operation for changing the posture of the three-dimensional images displayed in the picture SC1 has been received from the user at step S250. The method for calculating a rotation axis corresponding to the operation and a rotation angle corresponding to the operation may be either a known method or a method to be developed in the future. FIG. 8 shows an example state that the display control unit 365 has rotated each of the three-dimensional SEM image, the three-dimensional BSE image, and the EDS map shown in FIGS. 6 and 7 by the rotation angle corresponding to the operation received from the user about the rotation axis corresponding to the operation. As shown in FIG. 8, the postures of the three-dimensional SEM image displayed in the region R1, the three-dimensional BSE image displayed in the region R2, and the EDS map displayed in the region R3 have been changed to postures corresponding to the operation. As a result, even when the display control unit 365 has changed the postures of the three-dimensional SEM image displayed in the region R1, the three-dimensional BSE image displayed in the region R2, and the EDS map displayed in the region R3 according to the operation received from the user, the resulting postures can be kept identical to each other.

When receiving an operation for selecting a height of a cross section of the sample (an example of cross section information indicating a cross section) from the user at step S250, the display control unit 365 performs cross section changing processing of changing each three-dimensional images being displayed in the current three-dimensional image display picture to a three-dimensional image having a cutting surface obtained by cutting the three-dimensional images at a cross section indicated by the received height. The cross section changing processing will be described using an example that a certain three-dimensional image Z1 is displayed in the three-dimensional image display picture. In this case, the display control unit 365 determines, as a target sectional image, a sectional image representing a cross section concerned among the plural sectional images of the three-dimensional image Z1. The plural sectional images of the three-dimensional image Z1 are the plural sectional images that are laid on each other to form the three-dimensional image Z1. The display control unit 365 determines plural sectional images that satisfy a prescribed condition among the plural sectional images constituting the three-dimensional image Z1. The plural sectional images that satisfy the prescribed condition mean sectional images each of which is correlated with a height that is larger than or equal to the height correlated with the target sectional image determined by the display control unit 365 and smaller than or equal to the height correlated with the bottom sectional image. The display control unit 365 generates a new three-dimensional image Z2 on the basis of the determined plural sectional images that satisfy the prescribed condition. In this example, the bottom sectional image means the sectional image that is correlated with a largest height among the plural sectional images. The three-dimensional image Z2 is a three-dimensional image obtained by cutting the three-dimensional image Z1 at the cross section represented by the target sectional image, that is, the cross section indicated by the height received from the user. The display control unit 365 makes a change from the three-dimensional image Z1 being displayed in the current three-dimensional image display picture to the generated three-dimensional image Z2. In this manner, the display control unit 365 performs the cross section changing processing on the basis of the height concerned, that is, makes a change from the three-dimensional image being displayed in the current three-dimensional image display picture to the three-dimensional image having the cutting surface obtained by cutting the display control unit 365 at the cross section having the height concerned.

For example, the top SEM image among the plural SEM images of the three-dimensional SEM image displayed in the region R1 shown in FIG. 6 is a SEM image S11. In this example, the top SEM image means the SEM image that is correlated with the smallest height among the plural SEM images of the three-dimensional SEM image. The top BSE image among the plural BSE images of the three-dimensional BSE image displayed in the region R2 shown in FIG. 6 is a BSE image S21. In this example, the top BSE image means the BSE image that is correlated with the smallest height among the plural BSE images of the three-dimensional BSE image. The top EDS map among the plural EDS maps of the three-dimensional EDS map displayed in the region R3 shown in FIG. 6 is an EDS map S31. In this example, the top EDS map means the EDS map that is correlated with the smallest height among the plural EDS maps of the three-dimensional EDS map.

In the example shown in FIG. 6, when receiving information indicating a height of a cross section from the user, the display control unit 365 determines, as a target SEM image, a SEM image that is correlated with a height indicated by the received information. In this example, the display control unit 365 determines, as a target BSE image, a BSE image that is correlated with the height. In this example, the display control unit 365 determines, as a target EDS map, an EDS map that is correlated with the height. An example case that the target SEM image is a SEM image S12, the target BSE image is a BSE image S22, and the target EDS map is an EDS map S32 will be described below.

Figure 9:
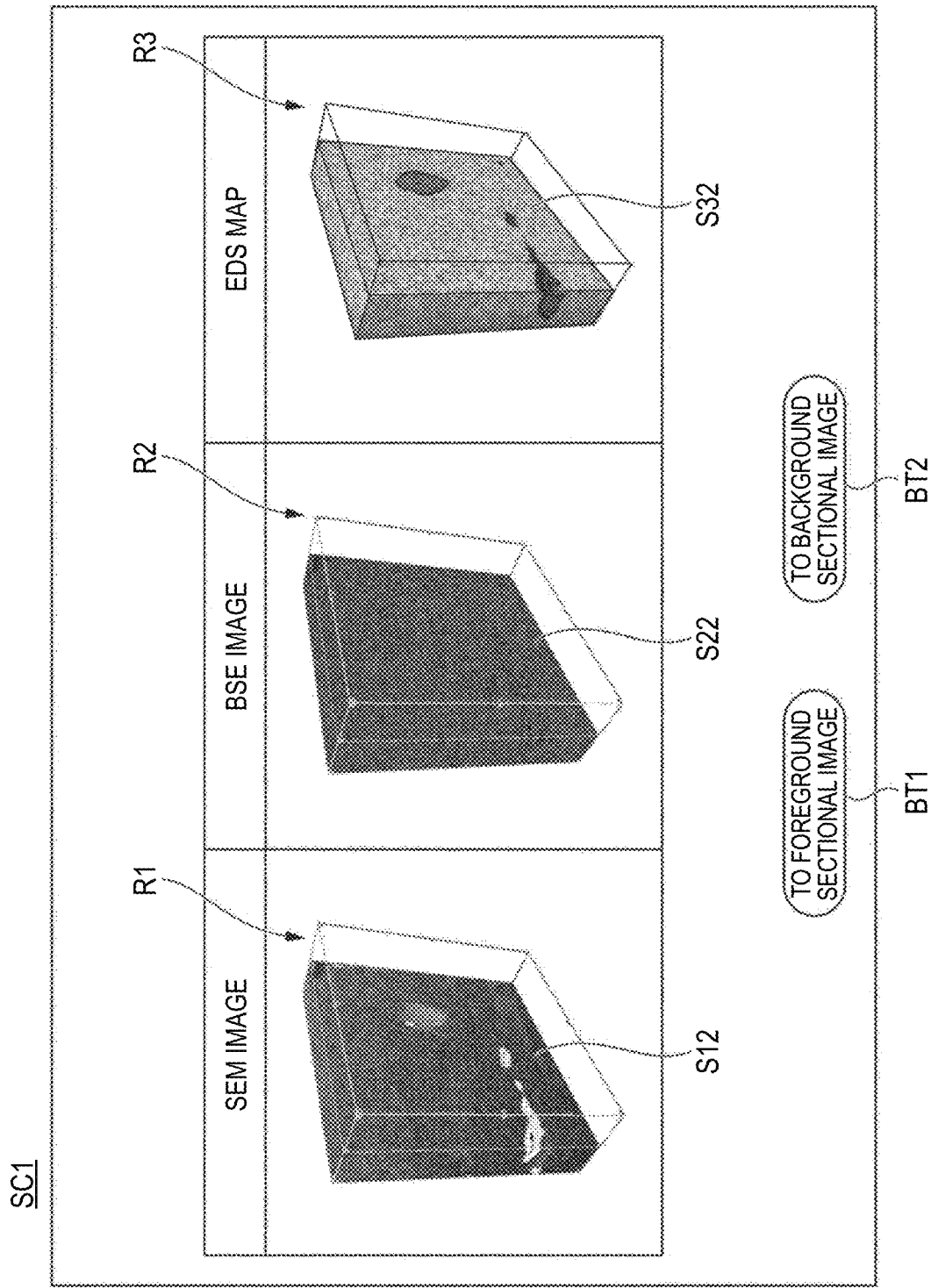
FIG. 9 shows an example of a picture SC1 that is displayed after execution of cross section changing processing on the picture SC1 shown in FIG. 6.

The display control unit 365 determines plural SEM images that satisfy a first prescribed condition among the plural SEM images of the three-dimensional SEM image displayed in the region R1 shown in FIG. 6. The plural SEM images that satisfy the first prescribed condition mean SEM images each of which is correlated with a height that is larger than or equal to the height correlated with the SEM image S12 determined as the target SEM image by the display control unit 365 and smaller than or equal to the height correlated with the bottom SEM image. The display control unit 365 generates a new three-dimensional SEM image on the basis of the plural sectional images that satisfy the first prescribed condition. Furthermore, the display control unit 365 determines plural BSE images that satisfy a second prescribed condition among the plural BSE images of the three-dimensional BSE image displayed in the region R2 shown in FIG. 6. The plural BSE images that satisfy the second prescribed condition mean BSE images each of which is correlated with a height that is larger than or equal to the height correlated with the BSE image S22 determined as the target BSE image by the display control unit 365 and smaller than or equal to the height correlated with the bottom BSE image. The display control unit 365 generates a new three-dimensional BSE image on the basis of the plural BSE images that satisfy the second prescribed condition. Still further, the display control unit 365 determines plural EDS maps that satisfy a third prescribed condition among the plural EDS maps of the three-dimensional EDS image displayed in the region R3 shown in FIG. 6. The plural EDS maps that satisfy the third prescribed condition mean EDS maps each of which is correlated with a height that is larger than or equal to the height correlated with the EDS map S32 determined as the target EDS map by the display control unit 365 and smaller than or equal to the height correlated with the bottom EDS map. The display control unit 365 generates a new three-dimensional EDS map on the basis of the plural EDS maps that satisfy the third prescribed condition. As shown in FIG. 9, the display control unit 365 makes a change from the three-dimensional SEM image shown in FIG. 6 to a newly generated three-dimensional SEM image. Furthermore, the display control unit 365 makes a change from the three-dimensional BSE image shown in FIG. 6 to a newly generated three-dimensional BSE image. Still further, the display control unit 365 makes a change from the three-dimensional EDS map shown in FIG. 6 to a newly generated three-dimensional EDS map. FIG. 9 shows an example picture SC1 that is displayed after execution of the cross section changing processing on the picture SC1 shown in FIG. 6.

The heights that are correlated with the respective top sectional images of the new three-dimensional SEM image, three-dimensional BSE image, and three-dimensional EDS map displayed in the above-described manner have the same height. That is, the user can cause display of plural different three-dimensional images having respective sectional images correlated with the input height by inputting, to the control device 30, information indicating a height in the three-dimensional image display picture. As a result, the cross section observing apparatus 1 allows plural different three-dimensional images to be compared with each other easily in each of which the top sectional image is a sectional image that is correlated with the input height.

Incidentally, the picture SC1 further includes a button BT1 and a button BT2.

The button BT1 is a button that allows the user to select a height that is one step (one slice width) higher than the height that is correlated with the top sectional images of respective three-dimensional images displayed in the picture SC1. For example, when the button BT1 is pushed down (clicked, tapped, or manipulated in a like manner), the display control unit 365 receives a height of the operation. Then the display control unit 365 performs cross section changing processing on the basis of the received height. The display control unit 365 performs nothing even if the button BT1 is manipulated if no sectional image exists at the height that is one step higher than the height that is correlated with the top sectional image of each three-dimensional image displayed in the picture SC1.

The button BT2 is a button that allows the user to select a height that is one step lower than the height that is correlated with the top sectional images of respective three-dimensional images displayed in the picture SC1. For example, when the button BT2 is pushed down (clicked, tapped, or manipulated in a like manner), the display control unit 365 receives a height of the operation. Then the display control unit 365 performs cross section changing processing on the basis of the received height. The display control unit 365 performs nothing even if the button BT2 is manipulated if no sectional image exists at the height that is one step lower than the height that is correlated with the top sectional image of each three-dimensional image displayed in the picture SC1.

In addition to the regions R1, R2, and R3 and the buttons BT1 and BT2, another GUI (graphical user interface) may be included in the picture SC1. The picture SC1 may be formed so as not to include either one or both of the buttons BT1 and BT2 or include another GUT in place of one or both of the buttons BT1 and BT2.

The display control unit 365 may be configured sp as to make the postures of plural three-dimensional images coincide with each other and make the positions of these respective three-dimensional images coincide with each other in the three-dimensional image display picture at step S270 on the basis of an operation received from the user through the three-dimensional image display picture at step S250. In this case, the display control unit 365 displays the three-dimensional images in such a manner that they are superimposed on each other in the three-dimensional image display picture. For example, the display control unit 365 determines a combination of two or more of the three-dimensional SEM image, the three-dimensional BSE image, and the three-dimensional EDS map.

An example case that the display control unit 365 decides on a combination of the three-dimensional SEM image and the three-dimensional EDS map. The display control unit 365 makes the postures of the determined three-dimensional SEM image and three-dimensional EDS map coincide with each other. Then the display control unit 365 makes the positions of the three-dimensional SEM image and three-dimensional EDS map coincide with each other in the three-dimensional image display picture. As a result, the display control unit 365 displays the three-dimensional SEM image and three-dimensional EDS map in such a manner that they are superimposed on each other in the three-dimensional image display picture. At this time, the display control unit 365 can change at least part of the transparency, hue, lightness, luminance, etc. of one or both of the three-dimensional SEM image and three-dimensional EDS map being displayed so as to be superimposed on each other in the three-dimensional image display picture, according to an operation received from the user. In this manner, the display control unit 365 can compare plural sets of sectional images that were obtained under different observation conditions in a state that they are superimposed on each other.

The display control unit 365 may be configured so as to enlarge or reduce three-dimensional images displayed in the three-dimensional image display picture on the basis of an operation received from the user through the three-dimensional image display picture at step S250. In this case, the display control unit 365 enlarges plural three-dimensional images displayed in the three-dimensional image display picture at the same magnification or reduces them at the same reduction ratio.

Furthermore, the display control unit 365 may be configured so as to display a three-dimensional image (e.g., three-dimensional SEM image) generated by the cross section observing apparatus 1 for the sample S and a three-dimensional image three-dimensional SEM image) generated by the cross section observing apparatus 1 for another sample K that has the same shape and size as the sample S in such a manner that they are superimposed on each other in the three-dimensional image display picture on the basis of an operation received from the user through the three-dimensional image display picture at step S250. In this case, the cross section observing apparatus 1 forms a prescribed mark in cross sections of the sample S and cross sections of the sample K by, for example, etching using a focused ion beam B1. Using these marks, the display control unit 365 displays these two three-dimensional images in such a manner that they coincide with each other in position and posture in the three-dimensional image display picture by such a method as pattern matching or coordinate conversion. Alternatively, in this case, the display control unit 365 detects edges of the two three-dimensional images and displays the two three-dimensional images in such a manner that they coincide with each other in position and posture in the three-dimensional image display picture on the basis of the detected edges. With this measure, the cross section observing apparatus 1 makes it possible to compare three-dimensional images obtained for different samples easily.

<Modification to Embodiment>

One modification to the illustrative embodiment will be described below with reference to FIG. 10. In the modification of the illustrative embodiment, in a process that the cross section observing apparatus 1 obtains pieces of sectional image information of respective cross sections of the sample S by sectional image information obtaining processing under each of three observation conditions, the control device 30 performs, in order, SEM image information obtaining processing, BSE image information obtaining processing, and EDS map information obtaining processing under the SEM image observation conditions, the BSE image observation conditions, and the EDS map observation conditions, respectively.

Figure 10:
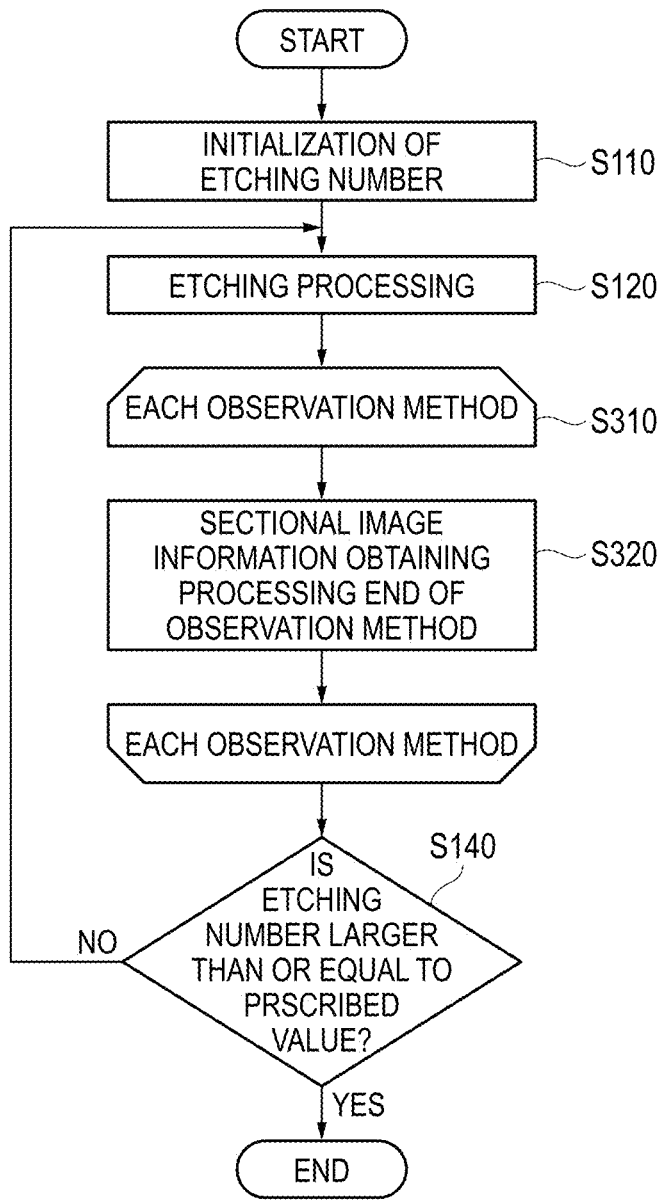
FIG. 10 is a flowchart showing another example flow of a process that the cross section observing apparatus 1 obtains pieces of sectional image information of respective cross sections of the sample S by sectional image information obtaining processing under each of three observation conditions.

FIG. 10 is a flowchart showing another example flow of a process that the cross section observing apparatus 1 obtains pieces of sectional image information of respective cross sections of the sample S by sectional image information obtaining processing under each of three observation conditions. Since steps S110, S120, and step S140 shown in FIG. 10 are the same as steps S110, S120, and step S140 shown in FIG. 4, respectively, descriptions of these steps will be omitted.

After executing step S120 shown in FIG. 10, the cross section observing apparatus 1 executes step S320 repeatedly under the three respective observation conditions (step S310). When step S310 is executed first time, the cross section observing apparatus 1 selects the SEM image observation conditions from among the three observation conditions. This is the first time step S310 is executed each time steps S120 to S140 shown in FIG. 10 are executed.

After one observation condition is selected from among the three observation condition at step S310, the cross section observing apparatus 1 performs sectional image information obtaining processing under the selected observation condition and thereby obtains pieces of sectional image information (step S320).

As described above, in the process that the cross section observing apparatus 1 obtains pieces of sectional image information of respective cross sections of the sample S by sectional image information obtaining processing under each of three observation conditions, even in the case where the cross section observing apparatus 1 performs, in order, SEM image information obtaining processing under the SEM image observation conditions, BSE image information obtaining processing under the BSE image observation conditions, and EDS map information obtaining processing under the EDS map observation conditions, the same advantages as described in the above illustrative embodiment can be obtained because first irradiation positions where irradiation is done with an electron beam B2 are specified in the first three-dimensional local coordinate system (i.e., one three-dimensional local coordinate system).

As described above, the above-described cross section observing apparatus 1 according to the illustrative embodiment is a cross section observing apparatus that exposes cross sections of an object (in this example, sample S) repeatedly by irradiating the object with a charged particle beam (in this example, focused ion beam B1 or electron beam B2) and obtains pieces of sectional image information representing at least part of the exposed cross sections, respectively, by irradiating the at least part of the cross sections with a charged particle beam, generates sectional images of the cross sections represented by the respective obtained pieces of sectional image information, and generates a three-dimensional image as a superimposition of the generated sectional images, wherein a first three-dimensional image (in this example, one of three-dimensional SEM image, three-dimensional BSE image, and three-dimensional EDS map) that is a three-dimensional image as a superimposition of first sectional images (in this example, one set of images among SEM images, BSE images, and EDS map) that are sectional images of the cross sections represented by respective pieces of sectional image information (in this example, one of SEM image information, BSE image information, and EDS map information) obtained under a first set of conditions this example, one set of image observation conditions among SEM image observation conditions, BSE image observation conditions, and EDS map observation conditions) among plural, different observation conditions and a second three-dimensional image (in this example, a three-dimensional image that is one of three-dimensional SEM image, three-dimensional BSE image, and three-dimensional EDS map and is different from the first three-dimensional image) that is a three-dimensional image as a superimposition of second sectional images (in this example, sectional images that are one set of images among SEM images, BSE images, and EDS map and are different from the first sectional images) that are sectional images of the cross sections represented by respective pieces of sectional image information (in this example, sectional image information that is one of SEM image information, BSE image information, and EDS map information and is different from the sectional image information obtained under the first condition) obtained under a second set of conditions (in this example, a condition that is one set of observation conditions among SEM image observation conditions, BSE image observation conditions, and EDS map observation conditions and is different from the first condition), different from the first set of conditions, among the plurality of observation conditions are displayed together on a display unit (in this example, the display unit of the display device 35).

In the cross section observing apparatus 1, the first three-dimensional image and the second three-dimensional image are displayed together on the display unit in such a manner as to coincide with each other in posture. With this measure, the cross section observing apparatus 1 makes it possible to compare, with each other, sets of sectional images obtained under different observation conditions in the three-dimensional image display picture virtually in the same direction.

In the cross section observing apparatus 1, the first three-dimensional image and the second three-dimensional image are displayed together on the display unit in such a manner as not to be superimposed on each other on the display unit according to an operation received from a user. With this measure, two different three-dimensional images that are not superimposed on each other on the display unit can be compared with each other easily.

In the cross section observing apparatus 1, the first three-dimensional image and the second three-dimensional image are displayed together on the display unit in such a manner as to be superimposed on each other in position and posture on the display unit according to an operation received from a user. With this measure, plural three-dimensional images that have been obtained under different observation conditions can be compared with each other in a superimposed state.

In the cross section observing apparatus 1, when information (in this example, a height that is correlated with a cross section) indicating a cross section represented by one first sectional image among the first sectional images that are superimposed on each other to form the first three-dimensional image is received from a user, the first sectional image representing the cross section indicated by the received information and a second sectional image representing the cross section among the second sectional images that are superimposed on each other to form the second three-dimensional image are displayed together on the display unit. With this measure, the cross section observing apparatus 1 allows the user to easily compare sectional images preferred by the user among plural sets of sectional images obtained under different observation conditions.

In the cross section observing apparatus 1, when an operation for changing the postures of the three-dimensional images displayed on the display unit is received, the posture of the first three-dimensional image and the posture of the second three-dimensional image are both changed to postures corresponding to the operation. With this measure, the cross section observing apparatus 1 allows the user to easily compare, with each other, sets of sectional images obtained under different observation conditions virtually in the same direction.

In the cross section observing apparatus 1, first processing (in this example, processing of generating a three-dimensional SEM image, a three-dimensional BSE image, or a three-dimensional EDS map at steps S220 to S240) of generating the first three-dimensional image by superimposing, on each other, the first sectional images of the cross sections represented by the respective pieces of sectional image information obtained under the first condition and second processing (in this example, processing, different from the first processing, of generating a three-dimensional SEM image, a three-dimensional BSE image, or a three-dimensional EDS map at steps S220 to S240) of generating the second three-dimensional image by superimposing, on each other, the second sectional images of the cross sections represented by the respective pieces of sectional image information obtained under the second condition are performed in parallel. With this measure, the cross section observing apparatus 1 makes it possible to shorten the time taken to obtain each set of sectional image information obtained under different observation conditions.

In the cross section observing apparatus 1, information (in this example, sets of pieces of information written in the SEM image information table, the BSE image information table, and the EDS map information table that are grouped according to the cross section information and thus correlated with each other) that correlates the pieces of sectional image information obtained under the first set of conditions with the pieces of sectional image information obtained under the second set of conditions is stored in a storage unit (in this example, storage unit 32), the information is obtained from the storage unit, and the first processing and the second processing are performed on the basis of the obtained information.

In the cross section observing apparatus 1, individual points of the first three-dimensional image and individual points of the second three-dimensional image represent positions in the same three-dimensional coordinate system (in this example, first three-dimensional local coordinate system). With this measure, the cross section observing apparatus 1 makes it possible to easily compare, with each other, sets of sectional images obtained for the object under different observation conditions on the basis of three-dimensional positions expressed by the same three-dimensional coordinate system.

The illustrative embodiment of the invention has been described above in detail with reference to the drawings, the specific configuration is not limited to the configuration of the illustrative embodiment and changes, replacements, deletions, etc. may be made without departing from the spirit and scope of the invention.

A program for implementing a function of a certain unit constituting one of the above-described devices (e.g., control device 30) may be recorded in a computer-readable recording medium and run in a state that it is read in a computer system. The term "computer system" as used herein includes such hardware as an OS (operating system) and peripheral devices. The term "computer-readable recording medium" means a portable medium such as a flexible disk, a magneto-optical disc, a ROM, a CD (compact disc)-ROM or a recording device, such as a hard disk drive, incorporated in the computer system. The term "computer-readable recording medium" further includes what holds the program for a certain time like a volatile memory (RAM) provided inside a computer system that serves as a server or a client when the program is transmitted over a network such as the Internet or a communication circuit such as a telephone circuit.

The above program may be transmitted from a computer system in which the program is stored in a storage device or the like to another computer system via a transmission medium or by transmission waves over a transmission medium. The "transmission medium" for transmitting the program means a medium having a function of transmitting information like a network (communication network) such as the Internet or a communication circuit (communication line) such as a telephone circuit.

The above program may be one for realizing part of the above-described function. Furthermore, the above program may be one configured to implement the above-described function in combination with a program already stored in a computer system, that is, what is called a differential file (differential program).

The present application claims priority of Patent Application No. 2017-060901 filed with the Japanese Patent Office on Mar. 27, 2017, all the disclosure of which is invoked in this application.

The invention claimed is:

1. A cross section observing apparatus comprising:
a display;
a charged particle microscope; and
a controller configured to:
control the charged particle microscope to irradiate an object with a charged particle beam to expose cross sections of the object repeatedly; and from among a plurality of the exposed cross sections, irradiate a group of cross sections comprising at least a part of the exposed cross sections with a charged particle beam to obtain pieces of sectional image information representing the group of cross sections;
generate sectional images of the group of cross sections represented by the respective obtained pieces of sectional image information;
generate a three-dimensional image by superimposing each of the generated sectional images; and
display a first three-dimensional image and a second three-dimensional image together on the display,
wherein the first three-dimensional image is a three-dimensional image obtained by superimposing first sectional images that are sectional images of the group of cross sections represented by respective pieces of the sectional image information obtained under a first condition from among a plurality of observation conditions that are different from one another, and
wherein the second three-dimensional image is a three-dimensional image obtained by superimposing second sectional images that are sectional images of the group of cross sections represented by respective pieces of the sectional image information obtained under a second condition from among the plurality of observation conditions, the second condition being different from the first condition.

2. The cross section observing apparatus according to claim 1, wherein the cross section observing apparatus is configured to display the first three-dimensional image and the second three-dimensional image together on the display in such a manner as to coincide with each other in posture.

3. The cross section observing apparatus according to claim 1, wherein the cross section observing apparatus is configured to display, according to an operation received from a user, the first three-dimensional image and the second three-dimensional image together on the display in such a manner as not to be superimposed on each other on the display.

4. The cross section observing apparatus according to claim 1, wherein the cross section observing apparatus is configured to display, according to an operation received from a user, the first three-dimensional image and the second three-dimensional image together on the display in such a manner as to be superimposed on each other in position and posture on the display.

5. The cross section observing apparatus according to claim 1, wherein the cross section observing apparatus is configured to
in a case information indicating the cross section represented by one of the first sectional images that are superimposed on each other to form the first three-dimensional image is received from a user, display the first sectional image representing the cross section indicated by the received information and the second sectional image representing the cross section among the second sectional images that are superimposed on each other to form the second three-dimensional image together on the display.

6. The cross section observing apparatus according to claim 1, wherein the cross section observing apparatus is configured to
in a case an operation for changing the postures of the three-dimensional images displayed on the display is received, change both of the posture of the first three-dimensional image and the posture of the second three-dimensional image to postures corresponding to the operation.

7. The cross section observing apparatus according to claim 1, wherein the cross section observing apparatus is configured to perform first processing and second processing in parallel, the first processing comprising generating the first three-dimensional image by superimposing, on each other, the first sectional images of the group of cross sections represented by the respective pieces of sectional image information obtained under the first condition, and the second processing comprising generating the second three-dimensional image by superimposing, on each other, the second sectional images of the group of cross sections represented by the respective pieces of sectional image information obtained under the second condition.

8. The cross section observing apparatus according to claim 7, wherein the cross section observing apparatus is configured to:

store information that correlates the pieces of sectional image information obtained under the first condition with the pieces of sectional image information obtained under the second condition in a storage; obtain the information from the storage unit; and perform the first processing and the second processing on the basis of the obtained information.

9. The cross section observing apparatus according to claim 1, wherein individual points of the first three-dimensional image and individual points of the second three-dimensional image represent positions in the same three-dimensional coordinate system.

10. A control method of a cross section observing apparatus comprising:

irradiating an object with a charged particle beam to expose cross sections of the object repeatedly;

from among a plurality of the exposed cross sections, irradiating a group of cross sections comprising at least a part of the exposed cross sections with a charged particle beam to obtain pieces of sectional image information representing the group of cross sections;

generating sectional images of the cross sections represented by the respective obtained pieces of sectional image information;

generating a three-dimensional image by superimposing each of the generated sectional images; and displaying a first three-dimensional image and a second three-dimensional image together on a display, wherein the first three-dimensional image is a three-dimensional image obtained by superimposing first sectional images that are sectional images of the group of cross sections represented by respective pieces of the sectional image information obtained under a first condition from among a plurality of observation conditions that are different from one another, and wherein the second three-dimensional image is a three-dimensional image obtained by superimposing second sectional images that are sectional images of the group of cross sections represented by respective pieces of the sectional image information obtained under a second condition from among the plurality of observation conditions, the second condition being different from the first condition.

* * * * *